US005285503A

United States Patent [19]

Satoh et al.

[11] Patent Number: 5,285,503

[45] Date of Patent: Feb. 8, 1994

[54] APPARATUS FOR REPRODUCING SOUND FIELD

[75] Inventors: Hirotoshi Satoh; Toshihito Sawai, both of Kobe, Japan

[73] Assignee: Fujitsu Ten Limited, Kobe, Japan

[21] Appl. No.: 743,339

[22] PCT Filed: Dec. 28, 1990

[86] PCT No.: PCT/JP90/01737

§ 371 Date: Aug. 28, 1991

§ 102(e) Date: Aug. 28, 1991

[87] PCT Pub. No.: WO91/10335

PCT Pub. Date: Jul. 11, 1991

[30] Foreign Application Priority Data

| | | | |
|---|---|---|---|
| Dec. 29, 1989 | [JP] | Japan | 1-153089[U] |
| Nov. 20, 1990 | [JP] | Japan | 2-312791 |
| Nov. 30, 1990 | [JP] | Japan | 2-333672 |

[51] Int. Cl.⁵ .......... H03G 3/00

[52] U.S. Cl. .......... 381/109; 381/17; 381/18; 381/86

[58] Field of Search .......... 381/17, 18, 86, 109

[56] References Cited

U.S. PATENT DOCUMENTS

| | | | |
|---|---|---|---|
| 4,320,254 | 3/1982 | Tottori et al. | 381/109 |
| 4,611,344 | 9/1986 | Hayama et al. | 381/109 |
| 5,027,687 | 7/1991 | Iwamatsu | 381/18 |
| 5,042,070 | 8/1991 | Linna et al. | 381/109 |
| 5,054,077 | 10/1991 | Suzuki | 381/109 |
| 5,060,272 | 10/1991 | Suzuki | 381/107 |
| 5,073,944 | 12/1991 | Hirasa | 381/86 |

FOREIGN PATENT DOCUMENTS

| | | | |
|---|---|---|---|
| 60-123200 | 7/1985 | Japan | H04S 7/00 |
| 60-230800 | 11/1985 | Japan | H04S 7/00 |
| 61-237599 | 10/1986 | Japan | H04S 1/00 |
| 61-191700 | 11/1986 | Japan | H04S 1/00 |
| 62-219899 | 9/1987 | Japan | H04S 1/00 |
| 64-5200 | 1/1989 | Japan | H04S 1/00 |
| 1-220599 | 9/1989 | Japan | H04S 5/02 |
| 1-220600 | 9/1989 | Japan | H04S 5/02 |

*Primary Examiner*—John K. Peng
*Assistant Examiner*—Edward Lefkowitz
*Attorney, Agent, or Firm*—Staas & Halsey

[57] ABSTRACT

This invention relates to a audio system installed in a vehicle. An apparatus for reproducing a sound field according to the invention includes a fader controlling circuit for separating a sound signal into predetermined channels to adjust a level of each separated sound signal depending on an amount of manipulation of a fader manipulating part, a sound field controller for performing a computing process of each sound signal obtained by the fader controlling circuit to form a desired sound inside a vehicle, and a relieving part invalidating a separate adjustment for the sound signal caused by the manipulation of the fader manipulating part while the sound field controller is operated. Therefore, when a manipulator selects the sound field controller to relieve the manipulation of a balance volume and fader volumes, even if the balance volume and fader volumes are not set at the center position, the sound field is adjusted automatically at the center position to enable the sound field controller to obtain maximum effect.

8 Claims, 26 Drawing Sheets

| Fig. 6A | Fig. 6B |
|---|---|

APPARATUS FOR REPRODUCING SOUND FIELD

BACKGROUND OF THE INVENTION

1. Field of the Invention

This invention relates to an audio system installed inside a vehicle.

Recently, many audio systems installed inside vehicles have been provided with a plurality of speakers generally reproducing stereo sounds and fader controlling circuits for adjusting a volume of sound reproduced by the speakers, arranged on the left and right sides and in the front and rear seat areas.

More particularly, this invention relates to the improvement in the use of incorporating a sound field controller in the audio system through the fader controlling circuit The sound field controller being capable of reproducing sound quality equivalent to that of an actual concert hall.

2. Description of the Related Art

Generally, the fader controlling circuit adjusts sound volume reproduced by the speakers arranged in the front seat and the rear seat areas in the vehicle or on the left and the right sides therein to allow listeners of each seat to enjoy the feeling experienced from listening to a localized or rear sound source. On the other hand, the sound field controller consists of a sound system of a DSP (Digital Signal Processor) as shown in JAPANESE UNEXAMINED PATENT PUBLICATION (Kokai) No. 1-220599 and No. 1-220600, for example, which realizes the presence and feeling of sound distribution equivalent to an actual concert hall by artificially producing direct sound arriving or origination from the sound source of the music source signal to create sound fields. These sound fields are selected for the kinds of listened music and the user's preference, the sound field of the concert hall is, for example, suitable for the performance of a symphony orchestra, etc.

A vehicle installed apparatus for reproducing sound fields has formerly controlled reproduced signal levels of sound emitted from each speaker so that it adjusts the position of localization for aiming a direction of a sound source since the number and position of the listeners changes Thus, the apparatus adjusts the fader controlling circuits with balance volumes for the left and right sides and with fader volumes for the front and rear areas depending on the number and sitting position of persons in the vehicle.

On the other the sound field controller consisting of or including a DSP is designed and controlled on the assumption that each channel signal from the sound signal source is input thereto relative to signal levels as it is, for example, on the assumption that the left and right side signals or the front and rear area signals are input in a state such that the signal levels are not adjusted. Consequently, the sound field controller is constituted to obtain a maximum effect in the center position of the balance volume and the fader volume. Thus, in the prior or above apparatus for reproducing sound fields the balance volume and fader volume need to be manually adjusted to the center position if the maximum effect is to be realized.

Therefore, in the above prior art, if the listeners select the sound field control process, they must adjust the balance volume and fader volume. Also, in the case of relieving the sound field control process, the repeated adjustment of the balance volume and fader volume is required and the manipulation for the adjustment of the sound to the position of localization is complex, i.e., to have the signal level of the sound reproduced to a desired level. Particularly, the above same complexity of the manipulation occurs in the use of the sound field controller when adjustments to the audio system are required in order to change the reproduced signal levels of the front and rear area speakers, and left and right side speakers corresponding to a different environment. The vehicle installed system having been preset with the fader control circuit.

SUMMARY OF THE INVENTION

It is an object of the present invention to provide an apparatus for reproducing a sound field for improving the manipulation in the case of the above problem.

With this object in view, the essence of the invention resides in an apparatus for reproducing a sound field including a sound signal source, a fader controlling circuit for separating the sound signals from the sound signal source into the predetermined channel signals and separated sounds signal to adjust the level of each separated sound signal depending on the amount of manipulation of a fader manipulating part and a sound field controller for performing a computing process of and adjusted by the fader controlling circuit form a desired sound field inside a vehicle, The apparatus includes a relieving means for invalidating a separate adjustment for the sound signals of the sound signal source caused by the manipulation of the fader manipulating part of the fader controlling circuit while said sound field controller is operated.

According to the invention, an input sound signal is separated into 4 channels of, for example, forward left and right, and rear left and right to provide a level balance of a sound signal reproduced from left and right, and front and rear speakers depending on an amount of manipulation of a balance volume and fader volumes, and to localize the sound field to a position at which the audience occupies.

On the other hand, when a manipulator operates a selecting switch to select the sound field controller, the balance volume and fader volumes are relieved by the relieving means so that the balance volume and fader volumes are at the center position to obtain the maximum effect of the apparatus for reproducing a sound field.

Therefore, even if the balance volume and the fader volumes are not set at the center position, the sound field is adjusted automatically to the center position to obtain the maximum effect of the apparatus for reproducing a sound field when the sound field controller is selected.

BRIEF DESCRIPTION OF THE DRAWINGS

The invention will be described in greater detail with reference to specific embodiments thereof and accompanying drawing, in which.

DESCRIPTION OF THE PREFERRED EMBODIMENT

Figure 1:
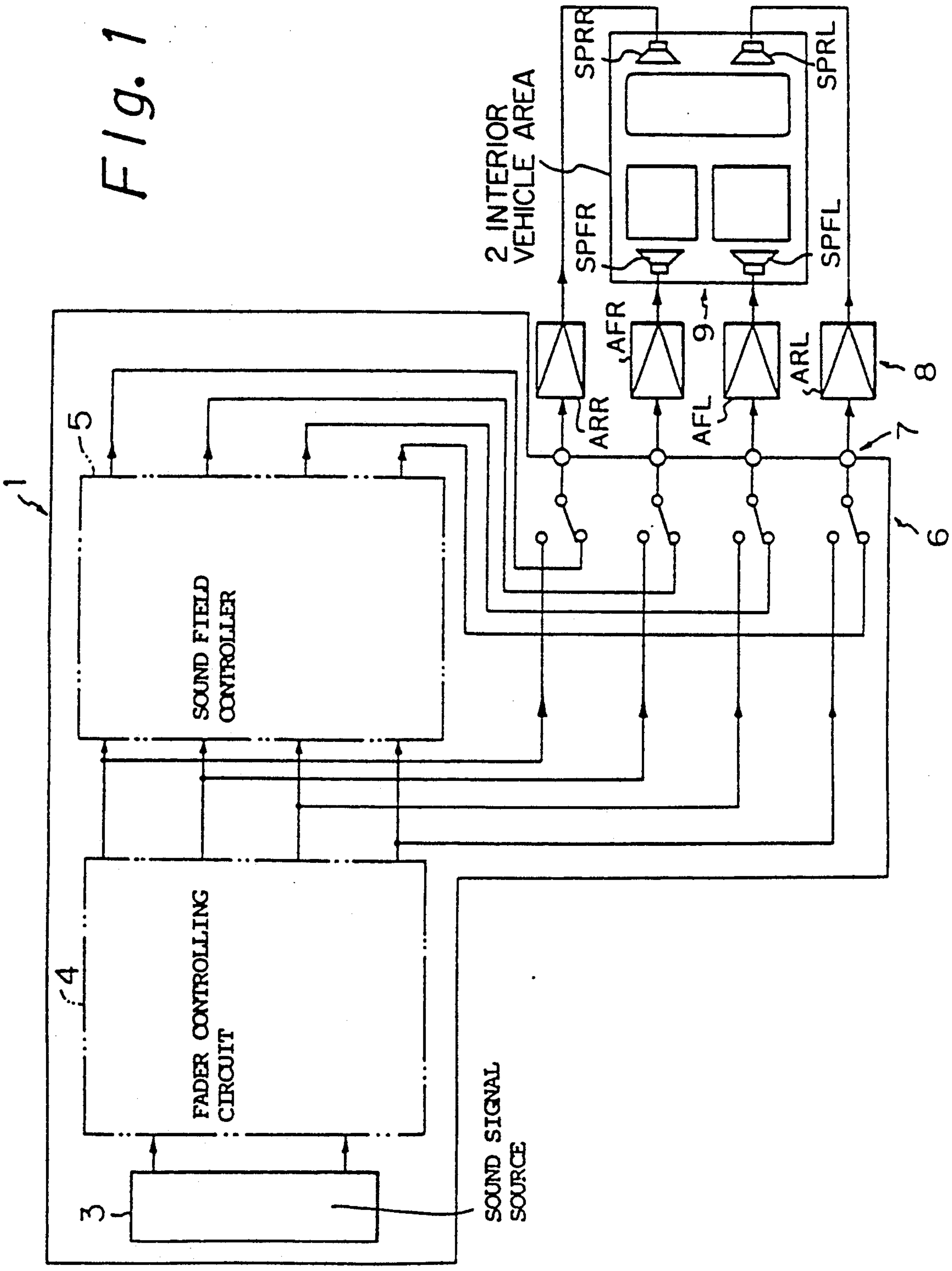
FIG. 1 is a view showing a prior apparatus for reproducing a sound field presupposing the present invention.

FIG. 1 is a view showing a prior apparatus for reproducing a sound field presupposing the present invention. Referring to FIG. 1, an interior vehicle area 2 accommodating an apparatus for reproducing a sound field 1, a power amplifier 8 (ARL, AFR, ARR) for amplifying a signal from the apparatus for reproducing a sound field 1, and speakers 9 including 4 channels wherein a speakers SPFL, SPFR, SPRL and SPRR are arranged respectively at the front left seat side, the front right seat side, the rear left seat side and the rear right seat side.

The apparatus for reproducing a sound field 1 includes a sound signal source 3, such as a compact disc player, a cassette player, etc. and, a fader controlling circuit 4 which separates left L and right R channels of stereo sound signals from the sound signal source into said 4 channels, and adjusts the signal levels among the channels and outputs as sound signals SFL, SFR; SRL, SRR (expressed as S in the case of a general term below). In addition, the apparatus includes a sound field controller 5 which performs an operational process on the sound signals to add then to initial reflection sound signals and reverberation sound signals and which adjusts a quality of sound, switches 6 for bypassing the sound field controller to output the fader controlling circuit 4, and outputs 7 for outputting signals of the switches 6.

Figure 2:
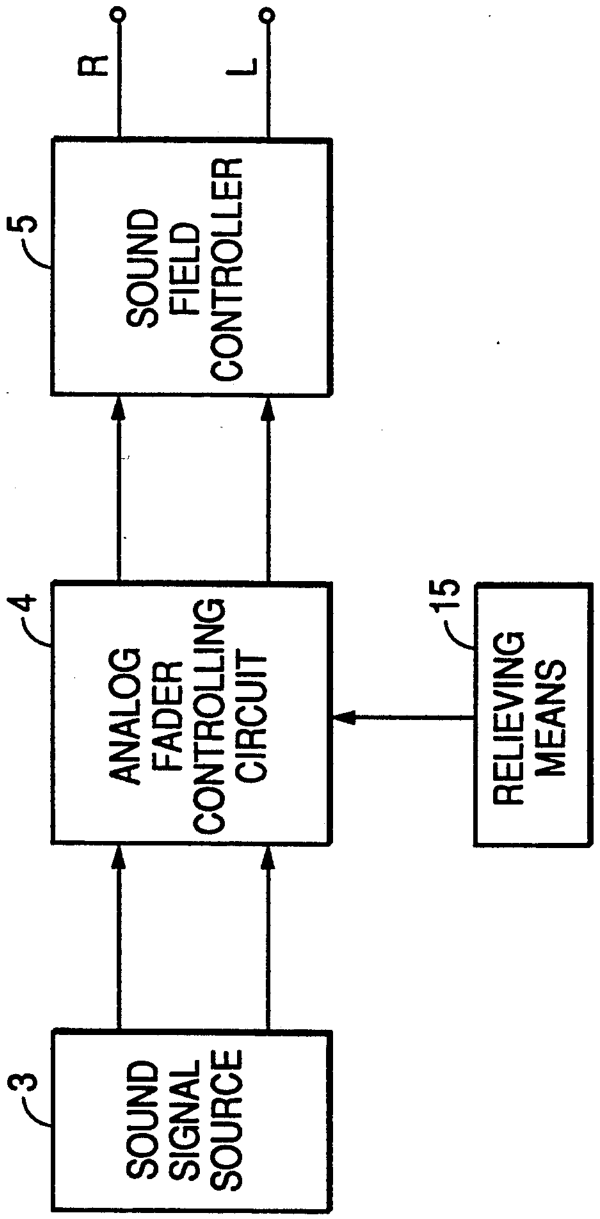
FIG. 2 is a view of principle constitution according to the invention.

FIG. 2 is a view of a principle constitution according to the invention. As shown in FIG. 2, an apparatus for reproducing a sound field 1 includes a sound signal source 3, and an analog type fader controlling circuit 4 which separates sound signals from the sound signal source 3 into predetermined channels and adjusts a sound position of localization formed by each separated sound signal inside a vehicle area corresponding to an amount in the manipulation of volume. In addition, the apparatus includes relieving means 15 for invalidating an adjustment of the sound signals from the sound signal source 3 to be separated caused by the manipulation of the volume when the sound field controller 5 is selected. The sound field controller 5 being a digital type, performing an operational process of each sound signal separated and adjusted by the fader controlling circuit 4 and forming a desired sound field inside a vehicle.

Figure 3A:
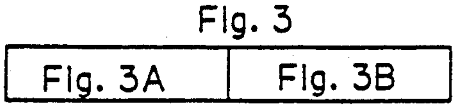
FIG. 3A and 3B are views showing an integral apparatus for reproducing a sound field according to the first embodiment of the invention.
Figure 3A:
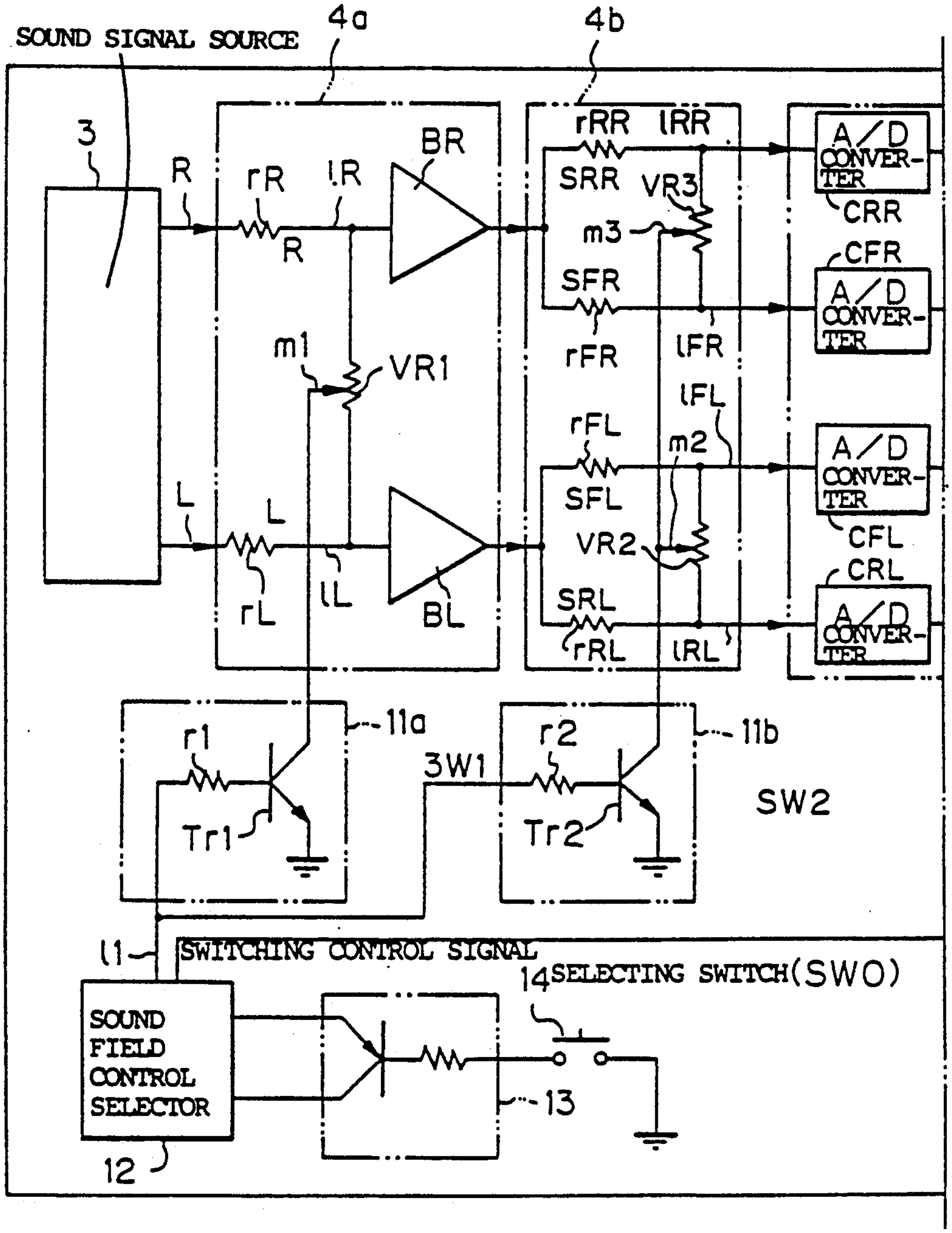
Figure 3B:
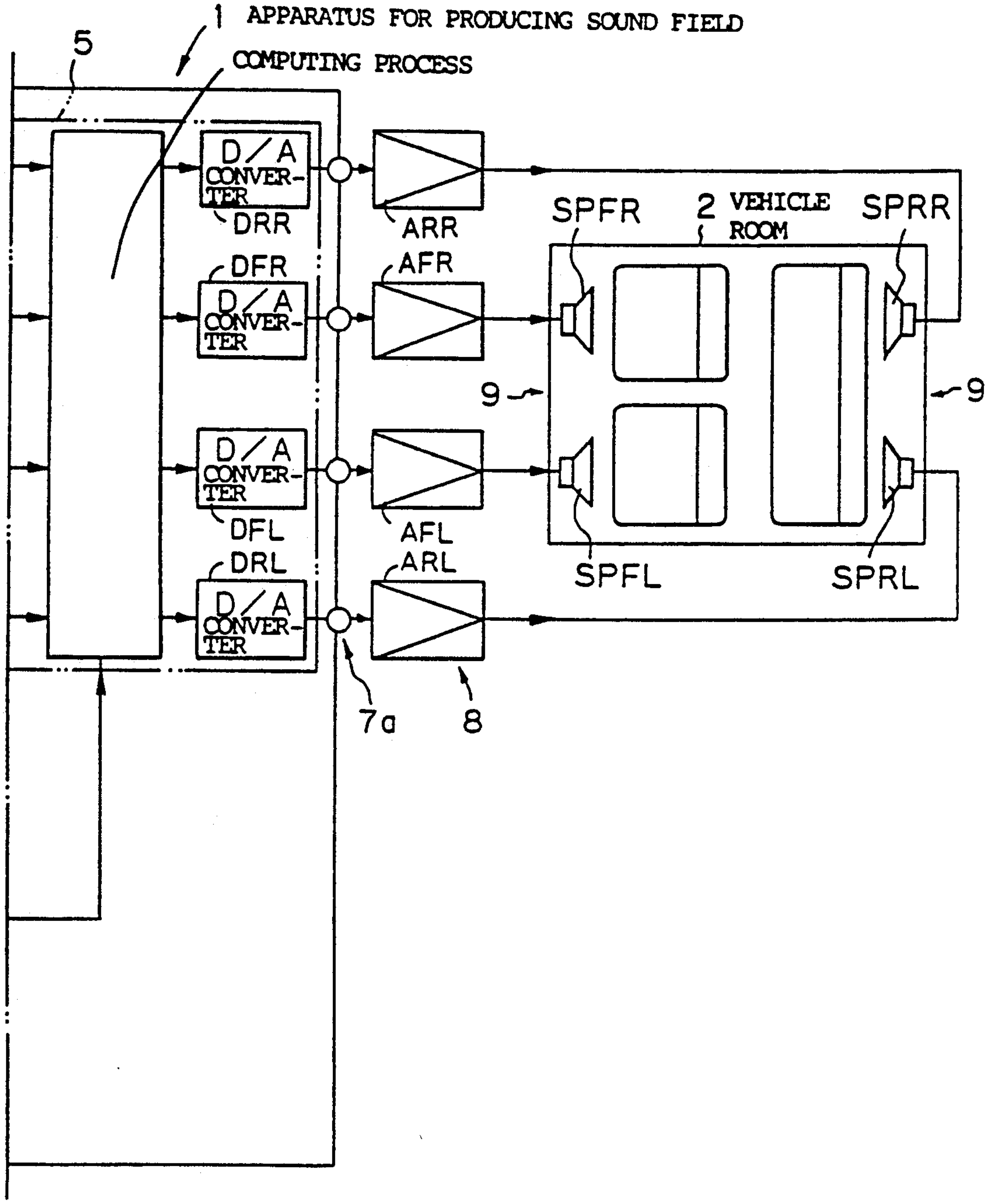

FIGS. 3A and 3B are views showing an integral apparatus for reproducing a sound field according to the first embodiment of the invention. In FIGS. 3A & 3B, a fader controlling circuit 4 is an analog circuit including a balance volume 4*a* for left and right, and a fader volume 4*b* for front and rear relative to vehicle seats. The balance volume 4*a* includes input resistors rL, rR, buffers BL, BR, and a volume VR1. Sound signals L of a left channel from the sound signal source are input to the buffer BL through a line lL from the input resistor rL and sound signals R of a right channel are input to the buffer BR through a line lR from the input resistor rR. The balance volume VR1 lies between lines lL and lR to adjust left and right sound volumes inside the vehicle 2. The fader volume 4*b* includes output resistors rFL, rFR, rRL, rRR and volumes VR2, VR3. Output signals from the buffer BL are separated into front and rear sound signals SFL and SRL of the left channel, the separated signal SFL is output to a line lFL from the resistor rFL, and the separated signal SRL is output to a line lRL from the resistor rRL. Similarly, output signals from the buffer BR are separated into front and rear sound signals SFR and SRR of the right channel, the separated signal SFR is output to a line lFR from the resistor rFR, and the separated signal SRR is output to a line lRR from the resistor rRR. There lies the fader volume VR2 between lines lFL and lRL and the fader volume VR3 between lines lFR and lRR to adjust front and rear sound volumes.

Also, the apparatus for reproducing sound field 1 is provided with a switching means 11*a* (SW1) relative to the balance VR1, and a switching means 11*b* (SW2) relative to the fader volume VR2 and VR3. The switching means 11*a* (SW1) includes a resistor r1 and a transistor Tr1, and the switching means 11*b* (SWb) includes a resistor r2 and a transistor Tr2. The transistors Tr1 and Tr2 perform ON/OFF operation responding to a switching control signal output from a sound field control selector 12 to a line l1 in correspondence with a manipulation of a selecting switch 14 (SW0) through a switch circuit 13. Also, the sound field controller 5 including a digital circuit mentioned later performs a start/stop of a sound field producing operation by setting multiplying coefficients of a variable multiplier 506 and 511 as shown in FIG. 4B to be 1 or 0 responding to the switching control signal. The sound field control selector 12 and the switching means 11*a*, 11*b* (SW1, SW2) forms the relieving means 15 of volume manipulation for automatically adjusting a sound field.

Additionally, the sound field controller 5 provided in the apparatus for reproducing sound field 1 comprises to digital analog converters (A/D) CFL, CFR; CRL, CRR for converting each sound signal S to digital signals respectively, a computing process circuit such as a Digital Signal Processor for processing signals converted by the A/D converter into reverberation signals, etc. and digital to analog converters (D/A) DFL, DFR, DRL, DRR for converting each processed signal to analog signals respectively.

Figure 4A:
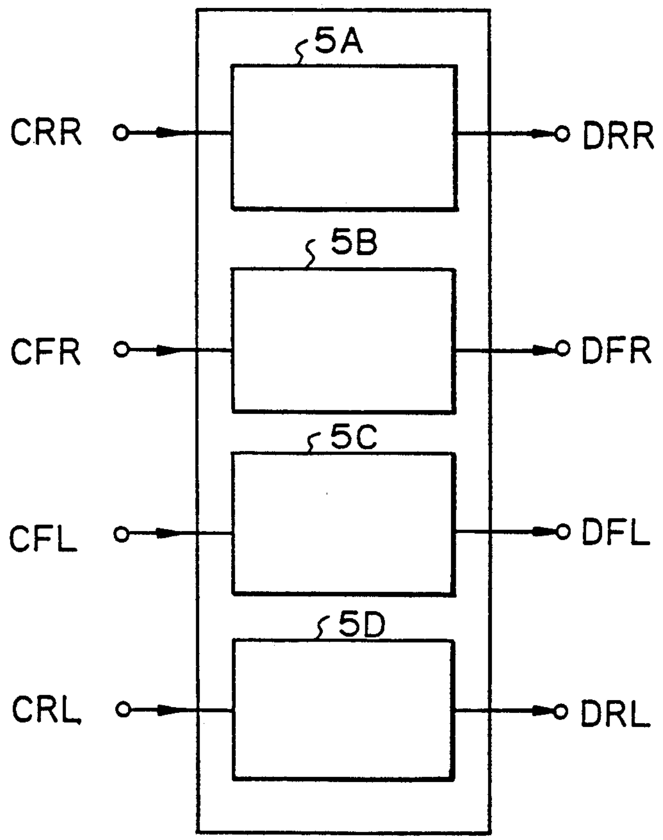
FIG. 4A is a view showing an arrangement of a computing circuit for each channel.
Figure 4B:
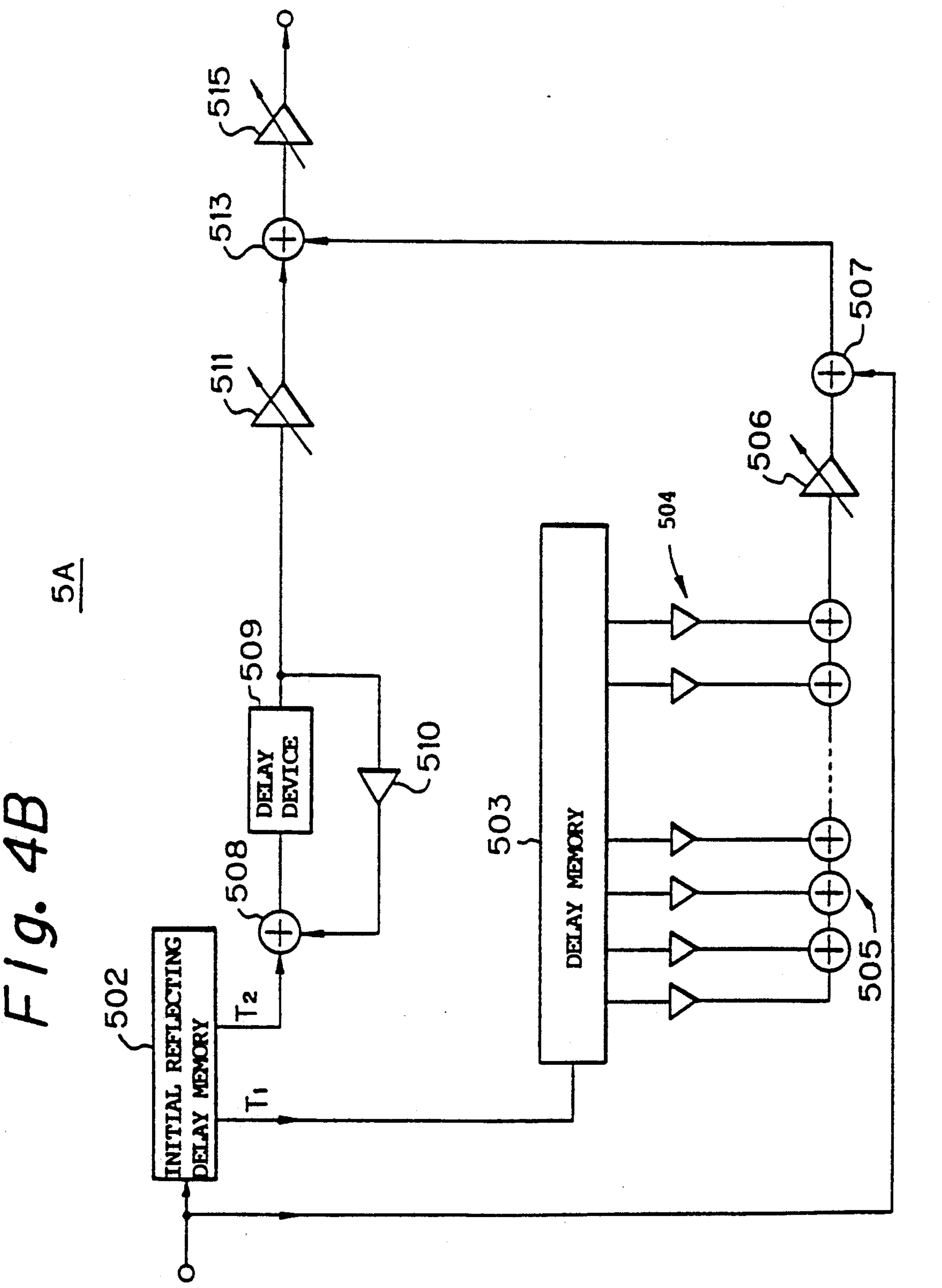
FIG. 4B is a view showing a configuration of a computing process circuit of FIG. 4A.

FIG. 4A is a view showing an arrangement of a computing circuit for each channel.

FIG. 4B is a view showing an configuration of one computing process circuit of FIG. 4A. As shown in FIG. 4A, each channel of the computing process circuits (5A, 5B, 5C, 5D) consists of a DSP (Digital Signal Processor) and as shown in FIG. 4B, one representative channel 5A for reproducing sound fields of music concerts includes an initial reflection sound production part including an initial reflection delay memory 502 for delaying a direct sound signal by $T_1$ and $T_2$ duration, a delay memory 503 receiving the direct sound signal delayed by $T_1$ duration, a plurality of multipliers 504 for multiplying each signal delayed by this delay memory 503 by certain coefficients, and a plurality of adders 505 for adding outputs of these multipliers 504, a reverberation sound producing part 51 including a variable multiplier 506 for performing a start/stop operation of said initial reflection sound production part, an adder 507 for adding output signals of the variable multiplier and said direct sound signals, a delay device 509 for delaying said $T_2$ duration delayed direct sound signals by $\Delta T$ duration, a multiplier 510 for multiplying signals of the delay device 509 by a certain coefficient, an adder 508 for adding output signals of the multiplier 510 and input signals of the delay device 509, a variable multiplier 511 for performing a start/stop operation of the reverberation sound producing part, an adder 513 for adding output signals of the variable multiplier 511 and the adder 507, and a variable multiplier 515 for varying output levels of the adder 513.

Figure 5:
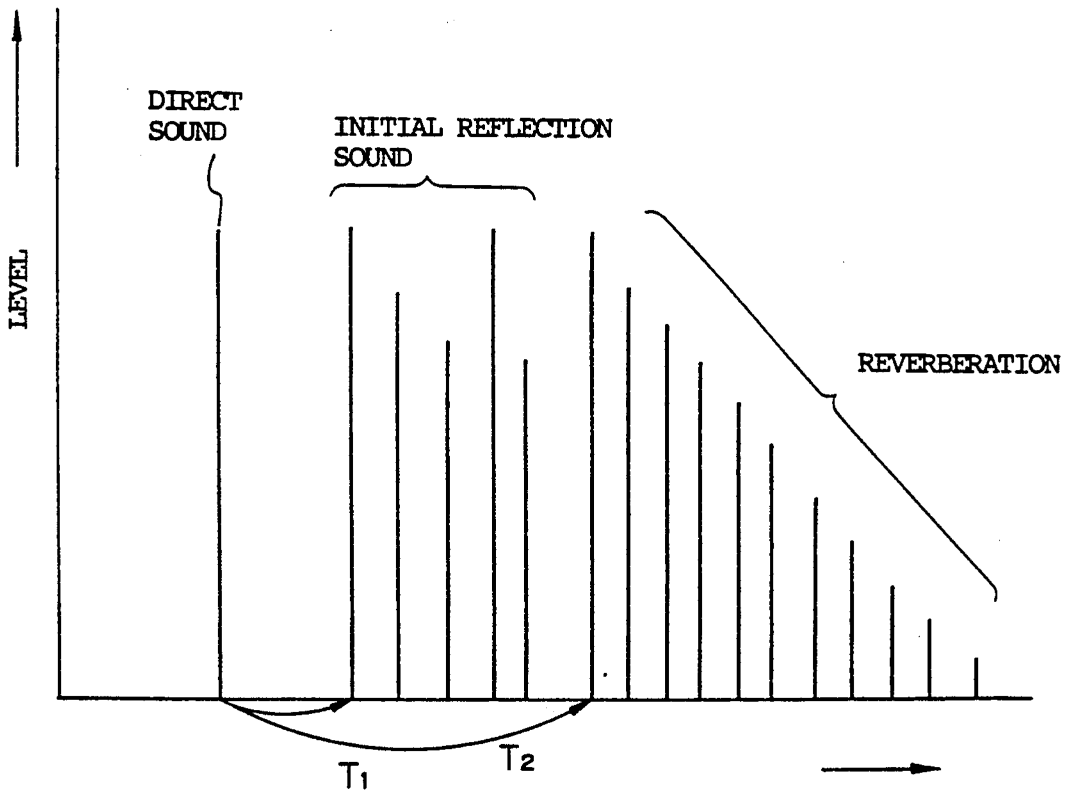
FIG. 5 is a view illustrating sounds produced by an initial reflection sound producing part and a reverberation sound producing part.

FIG. 5 is a view illustrating sounds produced by an initial reflection sound producing part and a reverberation sound producing part.

An adjustment of $T_1$ and $T_2$ duration and signal level in this Figure enables a feeling of sound distribution equivalent to an actual concert hall to be obtained.

Next, an operation of the apparatus for reproducing a sound field 1 constituted as the above is described with reference to FIGS. 3A and 3B. A switching control signal attains high level to pass through the transistor Tr1 and Tr2 when the sound field control process is not selected whereby the potential of moving pieces m1–m3 of the volumes VR1–VR3 is at ground level to reproduce the sound signals with the levels corresponding to the setting positions of the moving pieces from each speaker so that the reproduced sound field is localized at the desired position.

Each sound signal is directly input to the power amplifiers 8, ARR, AFR, AFl, ARD from the fader controlling circuit 4 passing through the A/D converter, through the computing process circuit wherein the multiplying coefficients of the variable multipliers 506 and through 511 are set to zero by the sound field control selector 12, and through the D/A converter of the sound field controller 5.

On the contrary, a switching control signal attains a low level in order to cut off the transistor Tr1 and Tr2 when the sound field control process is selected. Thus, the function of the volume VR1–VR3 is lost and each channel signal from the sound signal source 3 which maintains its original level passes through the A/D converter, through the computing process circuit wherein the multiplying coefficients of the variable multipliers 506 and 511 are set to 1 by the sound field control selector 12 and through the D/A converter so that each D/A converter for converting the input digital signals to the analog sound signals applies them to said each speaker 9 (SPFL, SPFR, SPRL, SPRR) through the corresponding power amplifiers 8 (AFL, AFR, ARL, ARR).

Thus, the sound which is processed in the digital signals by the computing process circuit, is reproduced inside the vehicle area 2.

Also, the reproduced sound is localized in the position corresponding to the position setting of said moving pieces m1–m3 when said sound field controller 5 is relieved.

Therefore, according to the apparatus for reproducing a sound field 1 of the invention, when the sound field controller 5 is selected, the balance volume and the fader volume is at the center position in spite of the setting positions of the moving pieces m1–m3 of the volume VR1–VR3 so that only the manipulation of a selecting switch (SW0) for selecting the sound field controller 5 enables it to reproduce a feeling of sound distribution equivalent to an actual concert. Also, when the sound field controller 5 is relieved, the sound reproduction is performed in the position localized before selecting the sound field controller 5 so that it is not necessary to manipulate the localization of the sound field even after the process of the sound field controller 5 and the manipulation is significantly improved.

Figures 6, 6A:
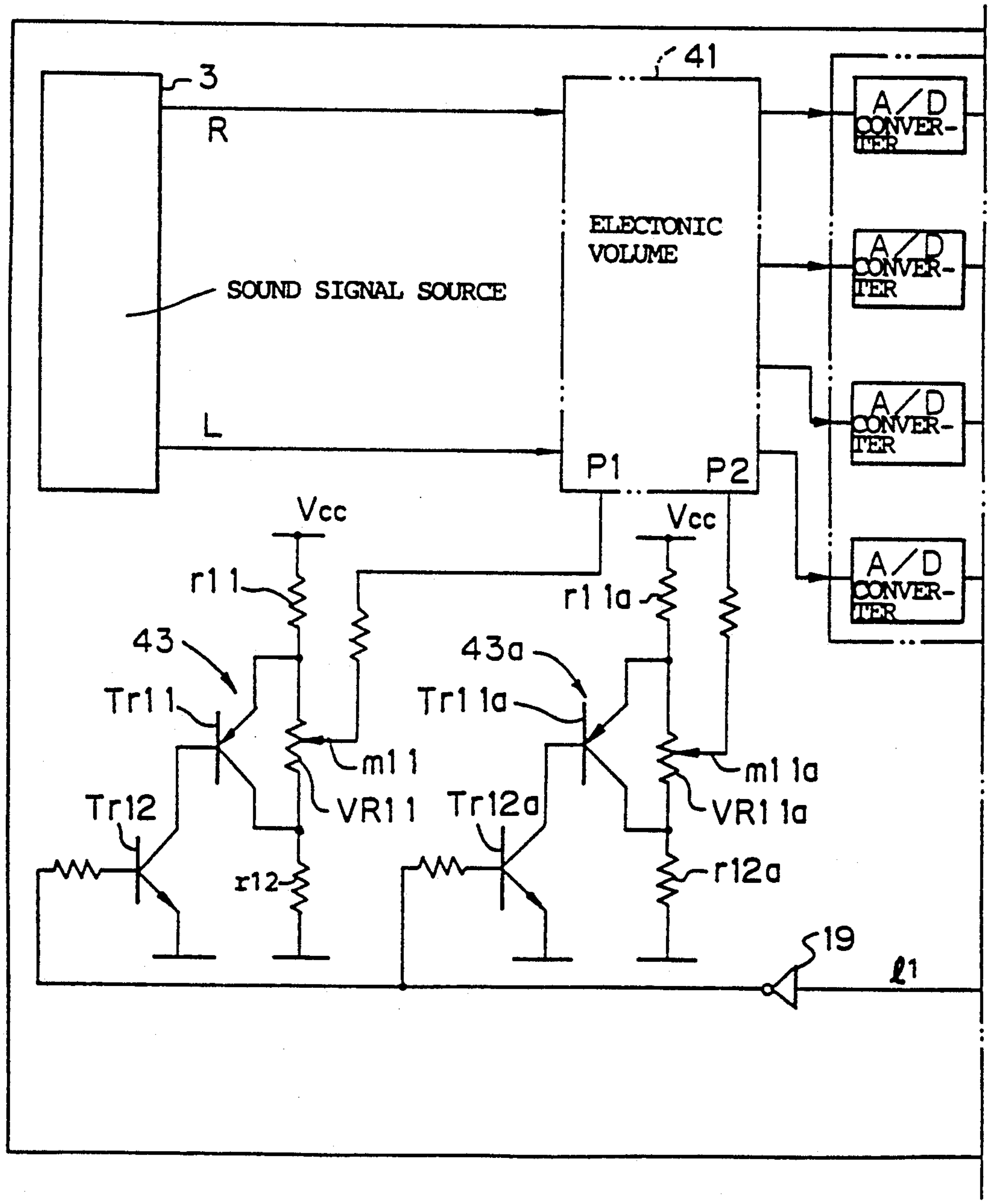
FIG. 6A and 6B are views showing an electrical configuration of an apparatus for reproducing a sound field according to the second embodiment of the invention.
Figure 6B:
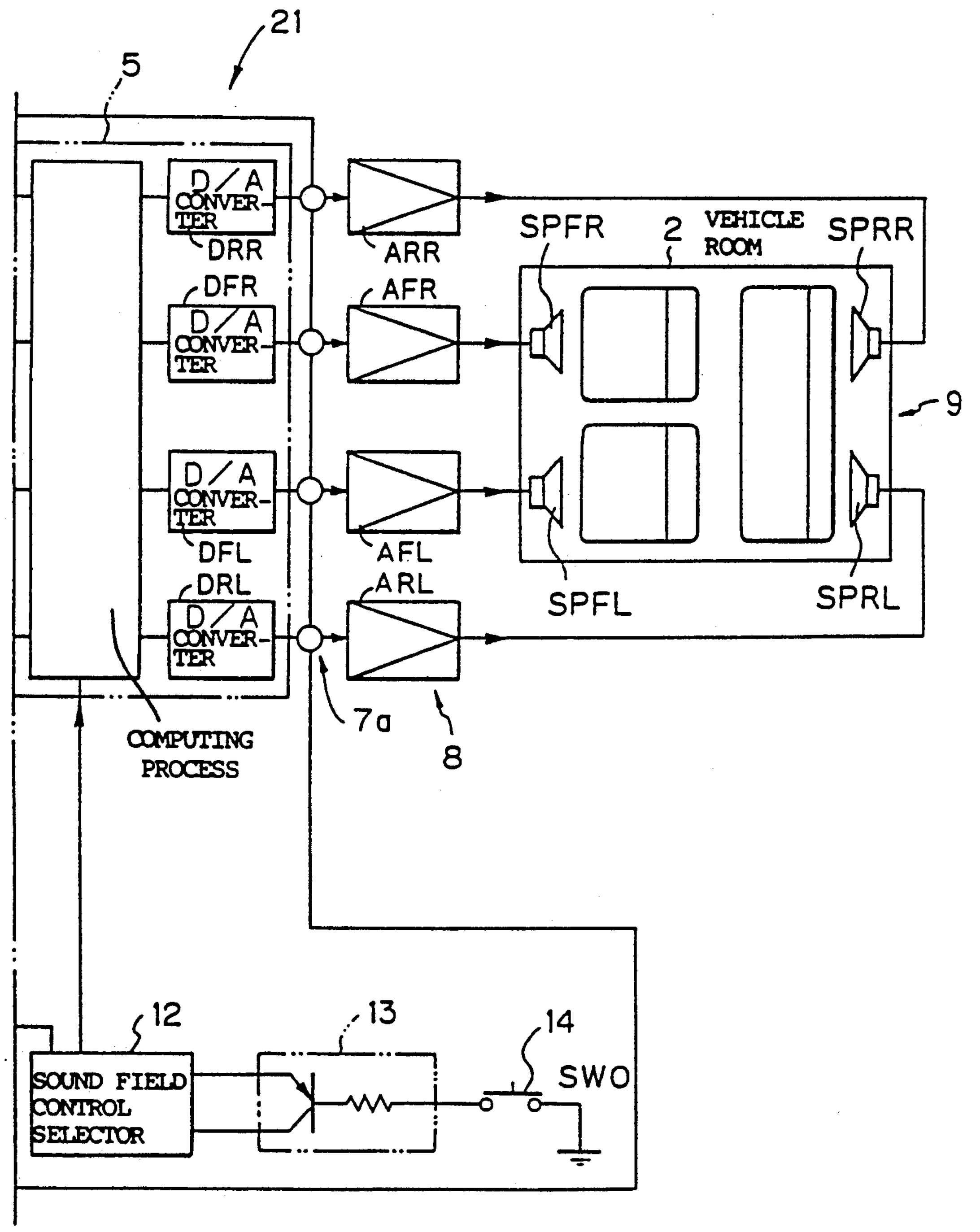

FIG. 6A and 6B are views showing an electrical configuration of an apparatus for reproducing a sound field according to the second embodiment of the invention. This embodiment is similar to the first embodiment and the parts corresponding to the first embodiment are given the same reference marks. This apparatus for reproducing a sound field 1 is provided with an electronic volume 41 instead of the fader controlling circuit 4 used in the above-mentioned apparatus for reproducing a sound field 1.

Thus, both channel left L and right R sound signals are input to the electronic volume 41 which performs a balance adjustment depending on a voltage level of a balance control input P1 and a fader adjustment depending on a voltage level of a fader control input P2, and outputs each sound signal S.

A high level voltage $V_{CC}$ applied to a level setting circuit including a resistor r11, a volume VR11 and a resistor in series is decided to be input to said balance control input P1. The switching control signal introduced to the line l1 is input to a transistor TR11 parallel with the volume VR11 through an inverter buffer 19 and a transistor Tr12.

When the sound field controller 5 is selected to allow the level of the line l1 to be low, the transistor Tr12 and the transistor Tr11 act as conductors so that the volume VR11 is bypassed across it by the transistor Tr11.

Therefore, the voltage $V_{CC}/2$ is output from a moving piece m11 to automatically adjust the balance at the center position.

Similarly, relative to said fader control input P2, a level setting circuit 43*a* is provided, the level setting circuit 43*a* being the same in constitution with the level setting circuit 43. And the parts of the level setting circuit 40A corresponding to the parts of said level setting circuit 43 is identified by the letter a added to the same reference mark.

Thus, when the sound field controller is selected, transistors Tr12a and Tr11a act as conductors to apply the voltage $V_{CC}/2$ to the fader control input so that the volume VR11 a is broadcast as if at the center position.

Thus, when the sound field controller 5 is selected, the maximum effect is obtained according to the apparatus for producing a sound field 1, as each channel signal from the sound signal source 3 is input to the sound field controller 5 with relation to an original level of the signal.

Also, respectively, left and right balance adjustments may be performed by the electronic volume 41 and the level setting circuit 43, and the rear and front fader volume adjustments may be performed by the resistors rFL, rFR, rFL, rRR, the volume VR2 and VR3 as shown in FIG. 3A.

Figure 7A:
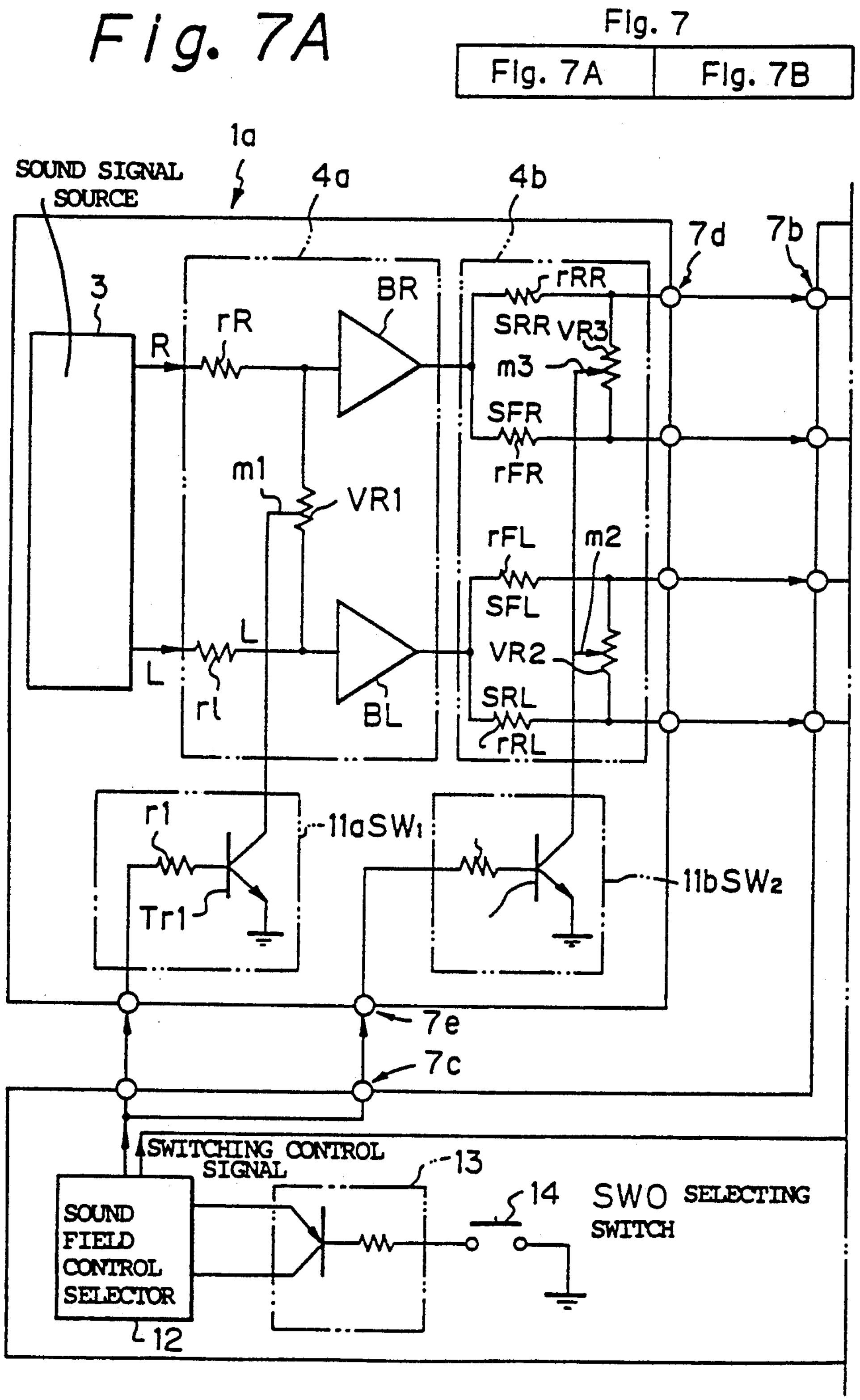
FIG. 7A and 7B are views showing a separate configuration of an apparatus for reproducing a sound field according to the third embodiment of the invention.
Figure 7B:
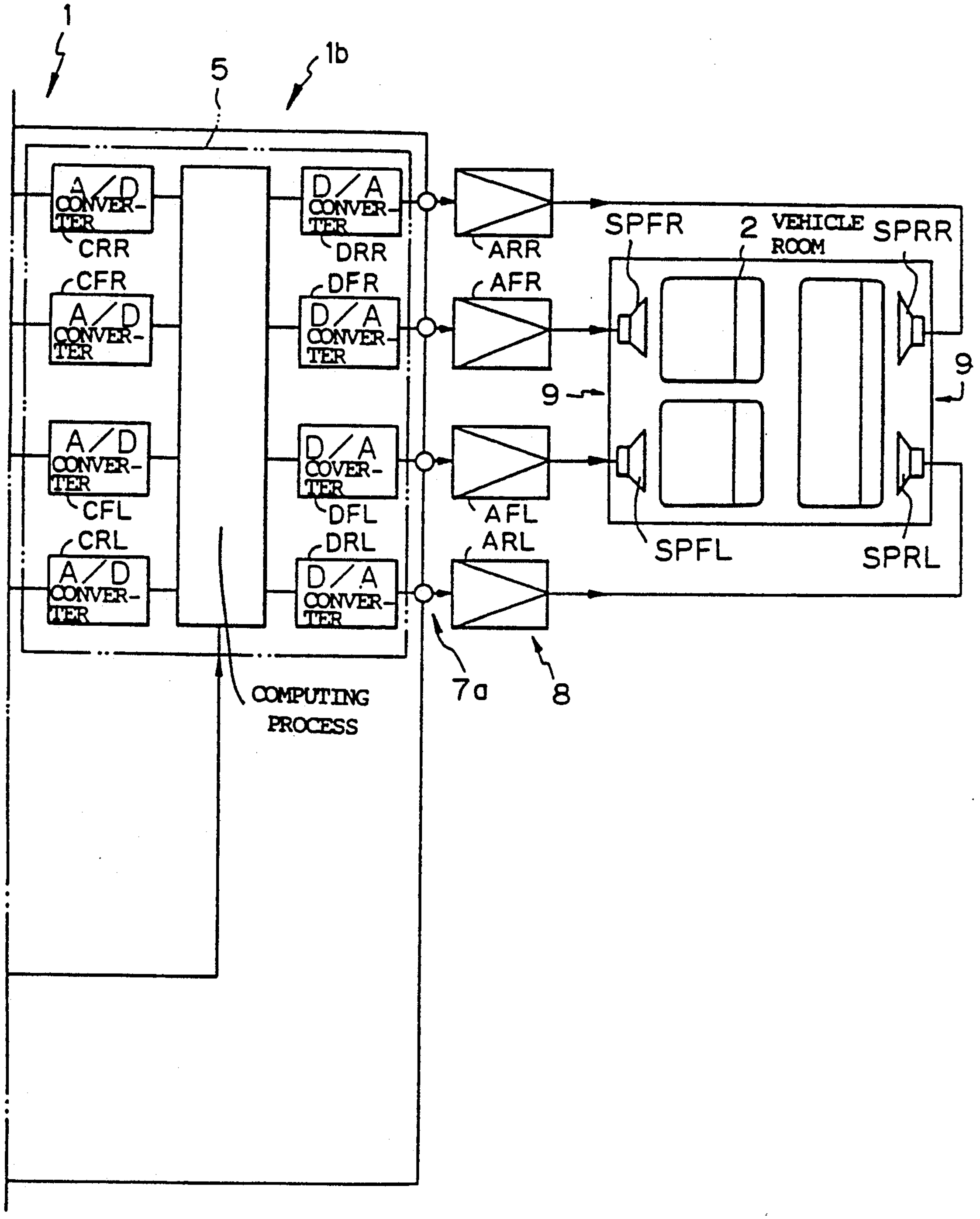

FIG. 7A and 7B are views showing a separate configuration of an apparatus for reproducing a sound field according to the third embodiment of the invention.

As shown in FIGS. 7A and 7B, the apparatus for reproducing a sound field 1 according to the first embodiment is separated into the first part for reproducing a sound field 1*a* and the second part for reproducing a sound field 1*b*. The first part for reproducing a sound field 1*a* comprises the sound signal source 3, the fader controlling circuit 4 (4*a*, 4*b*), the switching means 11 (11*a*, 11*b*), and terminals 7*d* and 7*e*. The reason why the first part for reproducing a sound field 1*a* includes the switching means 11, 11*a*, 11*b*, is that the switching means 11 is an analog circuit.

On the other hand, the second part for producing a sound field 1*b* includes the sound field controller 5, the sound field control selector 12, the switch circuit 13, the selecting switch 14, terminals 7*a*, 7*b* and 7*c*. Here, the terminal 7*a* may be connected to the power amplifier 8.

The reason for such separation is that the same manipulation with the first embodiment is obtained not only in the case where the first part for reproducing a sound field 1*a* is initially installed in a vehicle but also in the case where the second part for reproducing a sound field 1*b* is additionally installed in the vehicle.

Figure 8A:
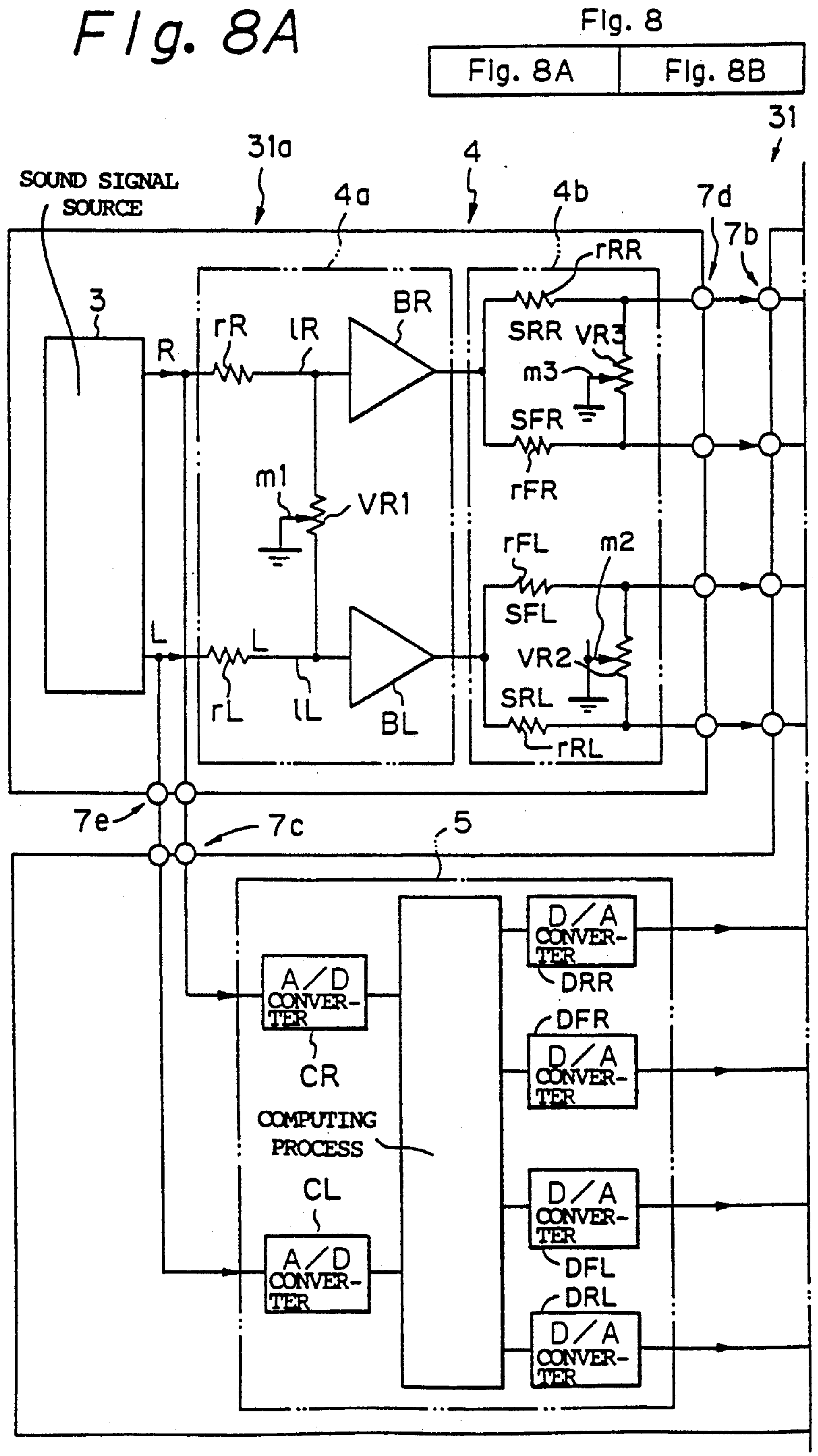
FIG. 8A and 8B are views showing a separate configuration of an apparatus for reproducing a sound field according to the fourth embodiment of the invention.
Figure 8B:
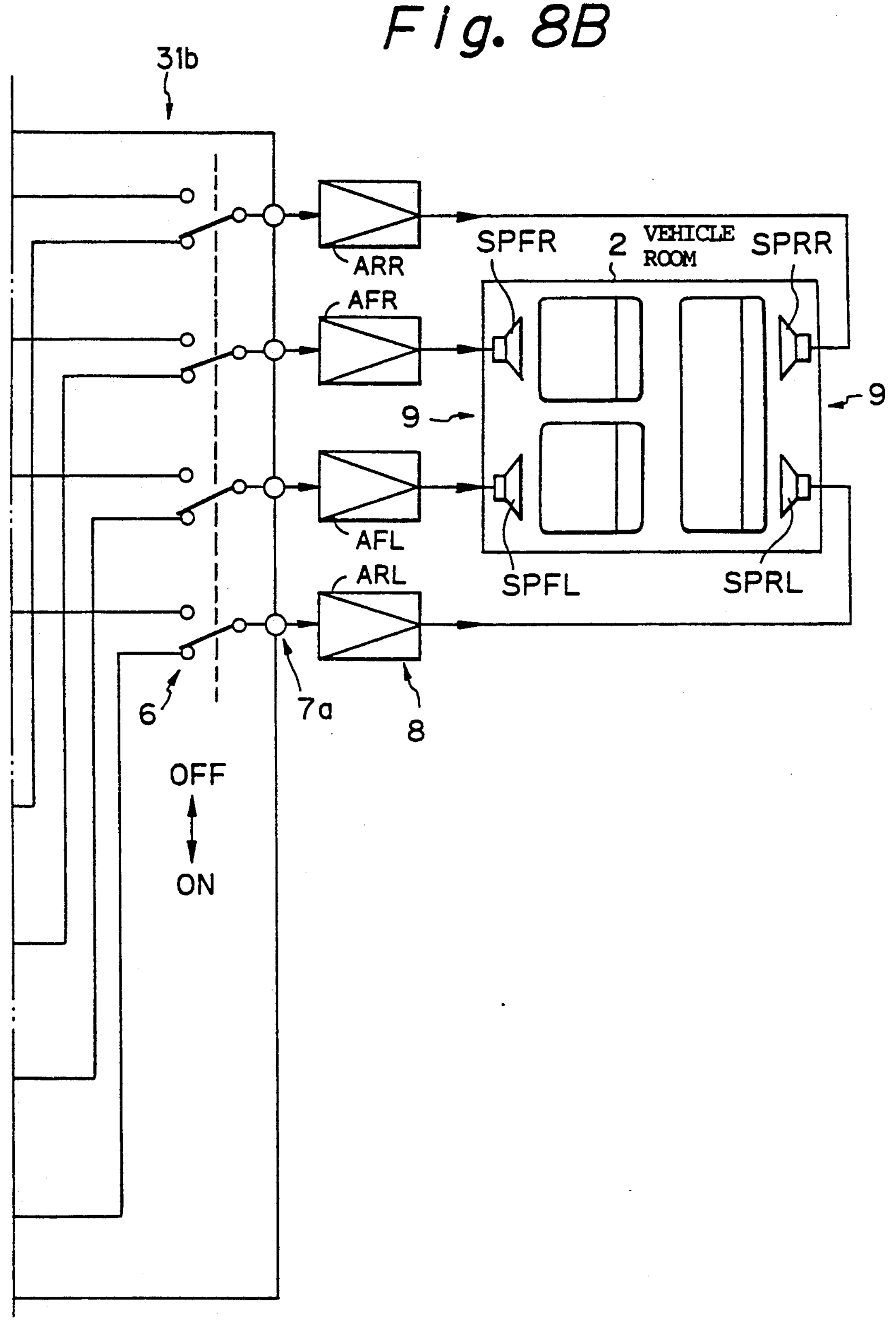

FIG. 8A and 8B are views showing a separate configuration of an apparatus for reproducing a sound field according to the fourth embodiment of the invention. As shown in FIGS. 8A and 8B the apparatus for reproducing a sound field 31 is separated into the first part for reproducing a sound field 31*a* and the second part for reproducing a sound field 31*b*. The first part for reproducing a sound field 31*a* includes the sound signal source 3, the fader controlling circuit 4 (4*a*, 4*b*), and terminals 7*d* and 7*e*. The second part for reproducing a sound field 31*b* includes the sound field controller 5, a switch means 6 for selecting between the first part 31A and the sound field controller 5, and terminals 7*a*, 7*b* and 7*c*. the case where the sound signal source 3 is provided with the terminal 7*e* in comparison with the separation according to the third embodiment, installing in the vehicle the second part 31*b* in addition to the first part 31*a*, the sound field controller 5 connected with the terminal 7*c* of the second part for reproducing a sound field 31*b* and the fader controlling circuit 4 are alternatively selected by the switching means 6. The selected sound field controller 5 is not influenced because of being separated wherever the volume position of the fader controlling circuit 4 is set.

Figure 9:
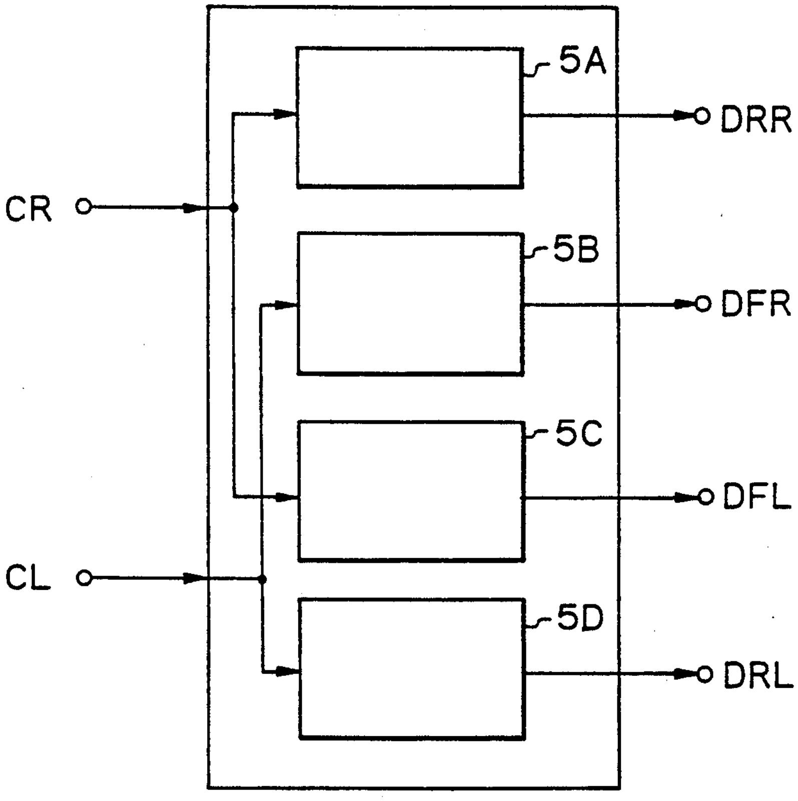
FIG. 9 is a view showing an arrangement of a computing circuit for each channel of FIGS. 8A and 8B.

FIG. 9 is a view showing an arrangement of a computing process circuit for each channel of FIG. 8. As shown in this Figure, R and L signals from the A/D converters CR and CL may be formed into signals for the D/A converters DRR and DFL, DFR and DRL, respectively.

Figure 10A:
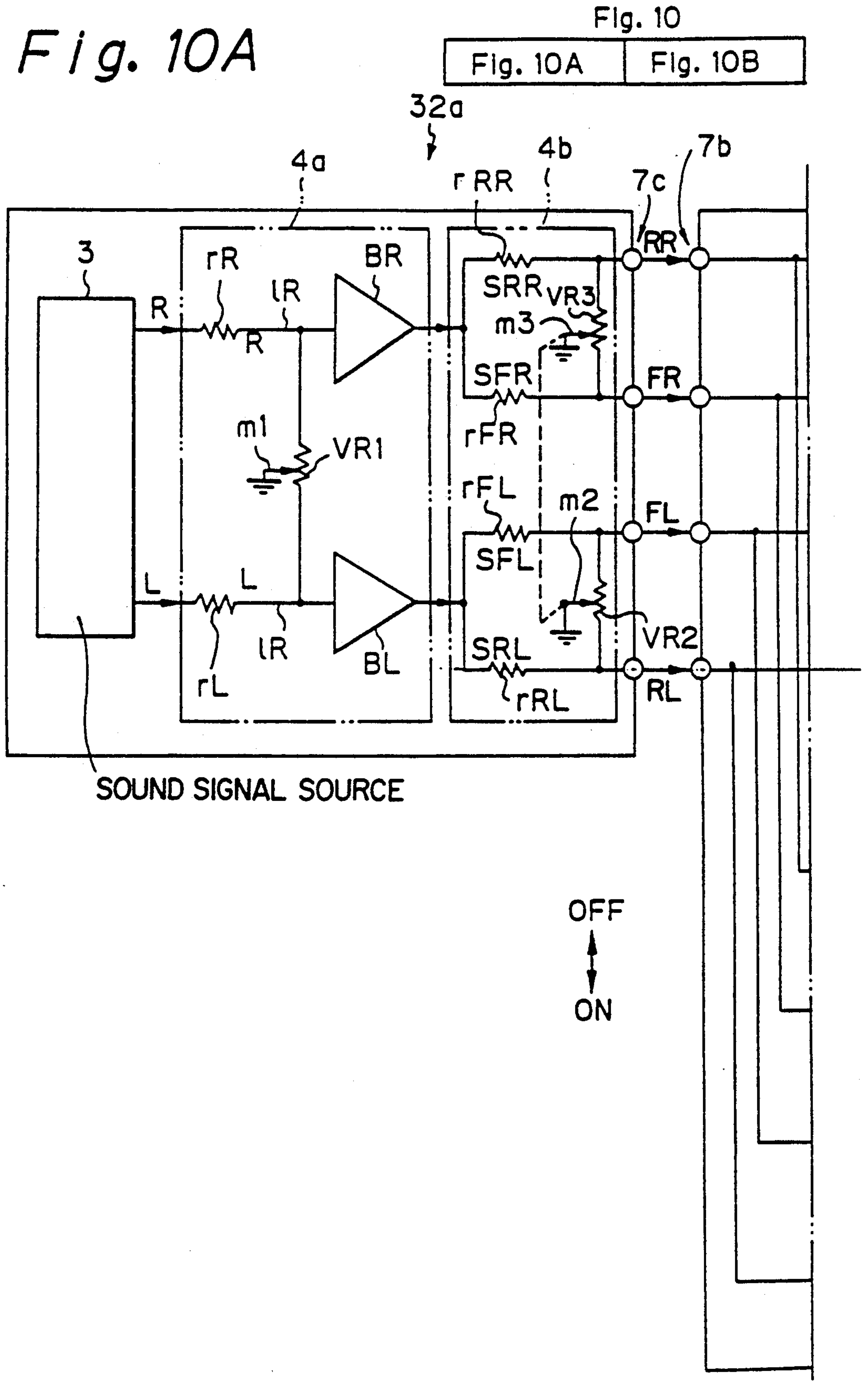
FIG. 10A and 10B are views showing a separate configuration of an apparatus for reproducing a sound field according to the fifth embodiment of the invention.
Figure 10B:
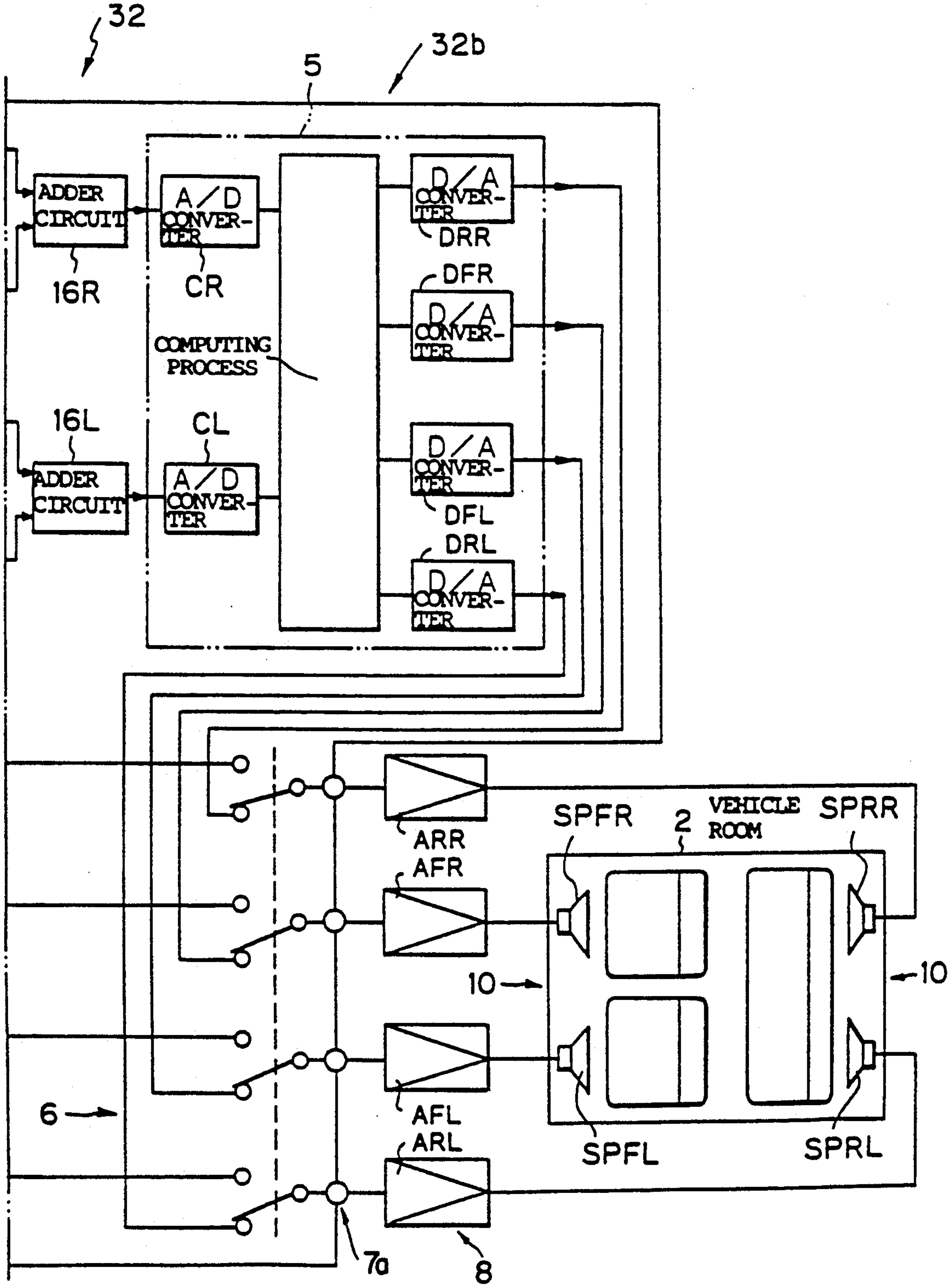

FIG. 10A and 10B are views showing a separate configuration of an apparatus for reproducing a sound field according to the fifth embodiment of the invention. As shown in this Figure, the apparatus for reproducing a sound field 32 is separated into the first part for reproducing a sound field 32*a* and the second part for reproducing a sound field 32*b*. The first part for reproducing a sound field 32*a* includes the sound signal source 3, the fader controlling circuit 4 (4*a*, 4*b*), and the terminal 7*c*. The second part for reproducing a sound field 32*b* comprises adder circuits 16R and 16L for adding each front and rear (RR, FR, Fl, RU) signals of the fader controlling circuit 4*b* in the first part for reproducing a sound field 32*a*, the sound field controller 5 connected to the output of the adder circuits 16R and 16L, and the switching means 6 for selecting alternatively the output signals of the sound field controller 5 and the input signals from the first part for reproducing a sound field 32*a*.

Figure 11:
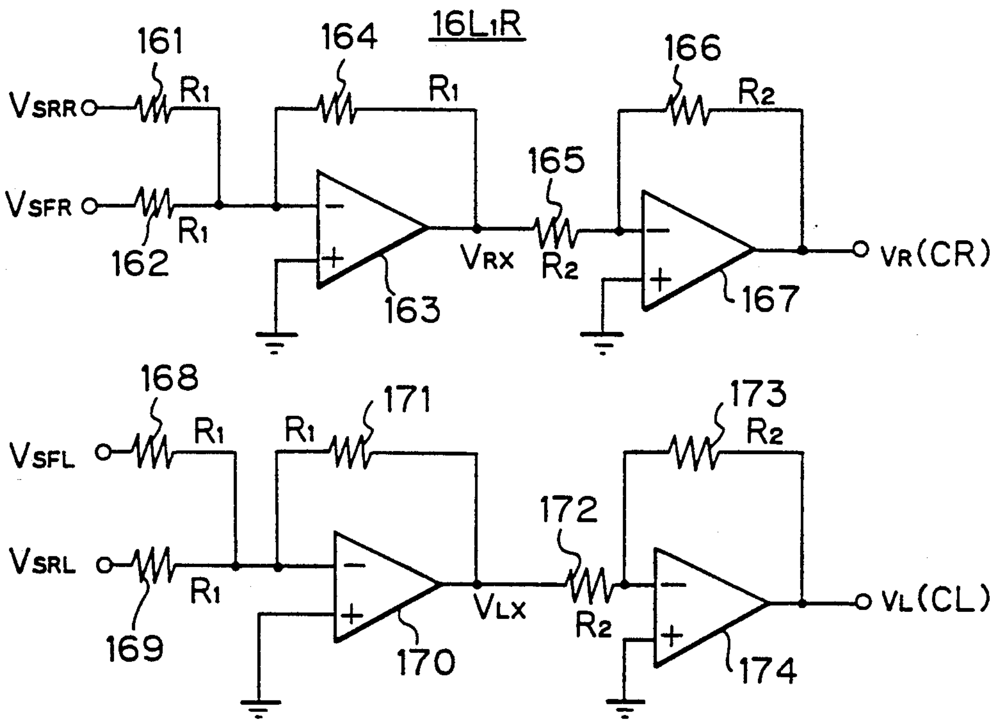
FIG. 11 is a view showing a configuration of an adder circuit of FIG. 10B.

FIG. 11 is a view showing a configuration of an adder circuit of FIG. 10B. As shown in this Figure, the adder circuits 16L and 16R are input with the voltage $V_{SRR}$ and $V_{SFR}$ of the right front and left signals SRR and SFR, and the voltage $V_{SFL}$ and $V_{SRL}$ of the left front and rear signals SFL and SRL, respectively. The adder circuit 16L and 16R include resistors 161, 162, 168 and 169 having resistance value R1, operational amplifiers 163 and 170 inverting terminals of which are connected to the other sides of the resistor 161, 162, 168 and 169 and non-inverting terminals of which are grounded, each resistor 164 and 171 for feed back of the operational amplifiers 163 and 170 having resistance value R1, each resistor 165 and 172 connected to the output of the operational amplifiers having resistance value R2, operational amplifiers 167 and 174 inverting terminals of which are connected to the other side of the resistors 165 and 172 and non-inverting terminals of which are grounded, and each resistor 166 and 173 for feed back of the operational amplifiers 167 and 174 having resistance value R2.

In this Figure, let the outputs of the operational amplifiers 163 and 170 be $V_{LX}$ and $V_{RX}$, respectively, the following equation holds. $(V_{SRR}-0)/R_1+(V_{SFR}-0)/R_1=(0-V_{RX})/R_1$, $(V_{SFL}-0)/R_1+(V_{SRL}0)/R_1=(0-V_{LX})/R_1$. Therefore, $V_{RX}=-(V_{SRR}+V_{SFR})$, $V_{LX}=-(V_{SFR}+V_{SRL})$. Additionally, let the output of each operational amplifier 167 and 174 be $V_L$, $V_R$, the following equation holds. $(V_{RX}-0)/R_2=(0-V_R)/R_2$, $(V_{LX}-0)/R_2 32 (0-V_L)/R_2$. Therefore, the right side signal $V_R=-V_{RX}=V_{SRR}+V_{SFR}$, the left side signal $V_L=-V_{LX}=V_{SFR}+V_{SRL}$.

In comparison with the fourth embodiment, in the fifth embodiment the first part for reproducing a sound field 32*a* is not provided with terminals for taking out signals from the sound signal source directly. However, the terminals 7*b* of the second part for reproducing a sound field 32*b* FIG. 10A are connected to the terminals 7c of the first part for reproducing a sound field 32a so that the adder circuits enable the computing process circuit to perform a computing process using signals formed before being divided by the resistors rFL and rRL, and rRR and rFR and are not influenced by the position of volume VR2 and VR3 in the fader controlling circuit 4b. Additionally, these adder circuits 16R and 16L are provided to prevent the influence in change of the volumes VR2 and VR3, not VR1, of the fader controlling circuit because the audio system in the case of installing in a vehicle, the volume VR1 for controlling the left and right balance might normally be low in frequency of adjustment.

Figure 12A:
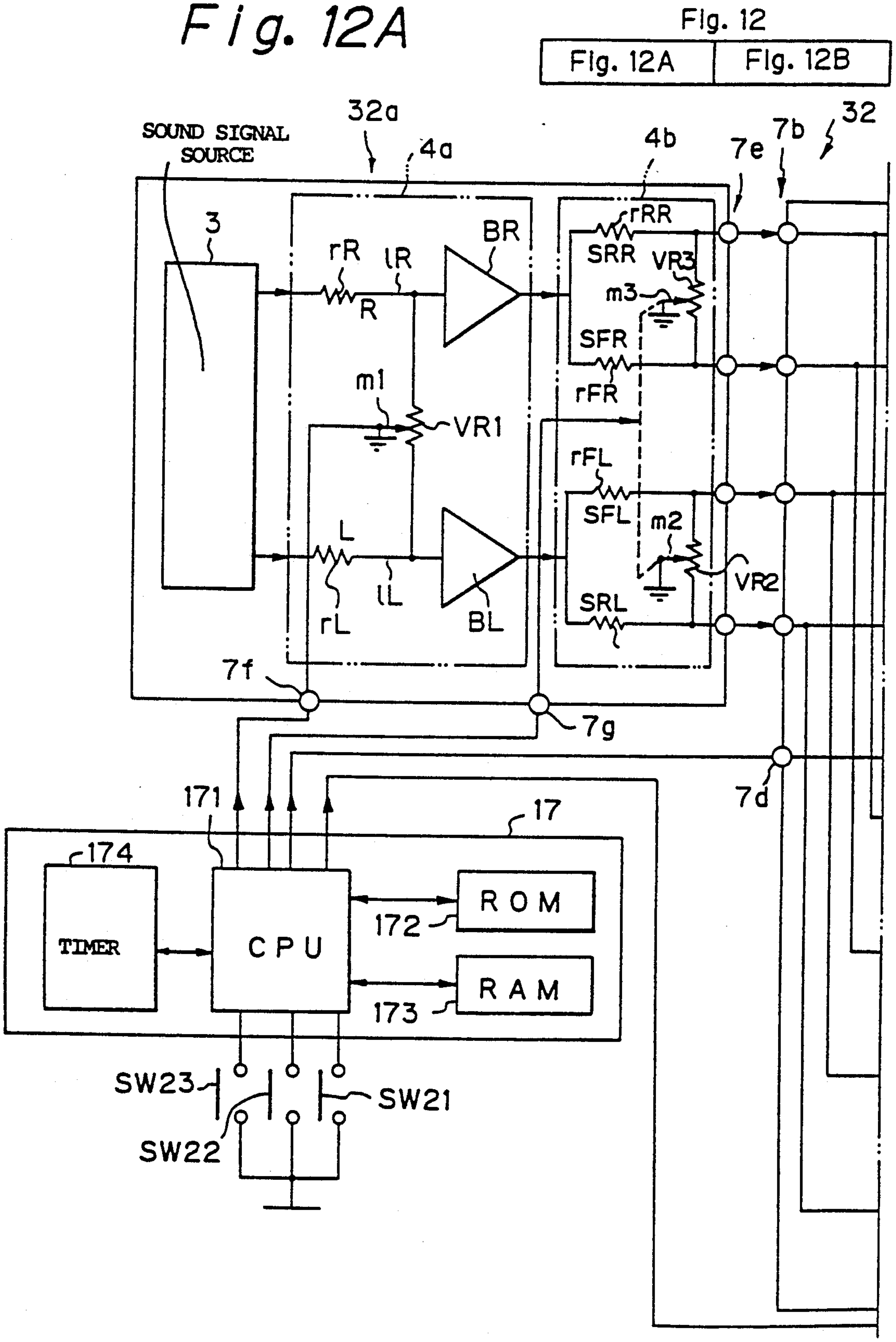
FIG. 12A and 12B are views view showing a configuration controlling an fader controlling circuit and a sound field controller of an apparatus for reproducing a sound field using a common button switch, according to the sixth embodiment of the invention.
Figure 12B:
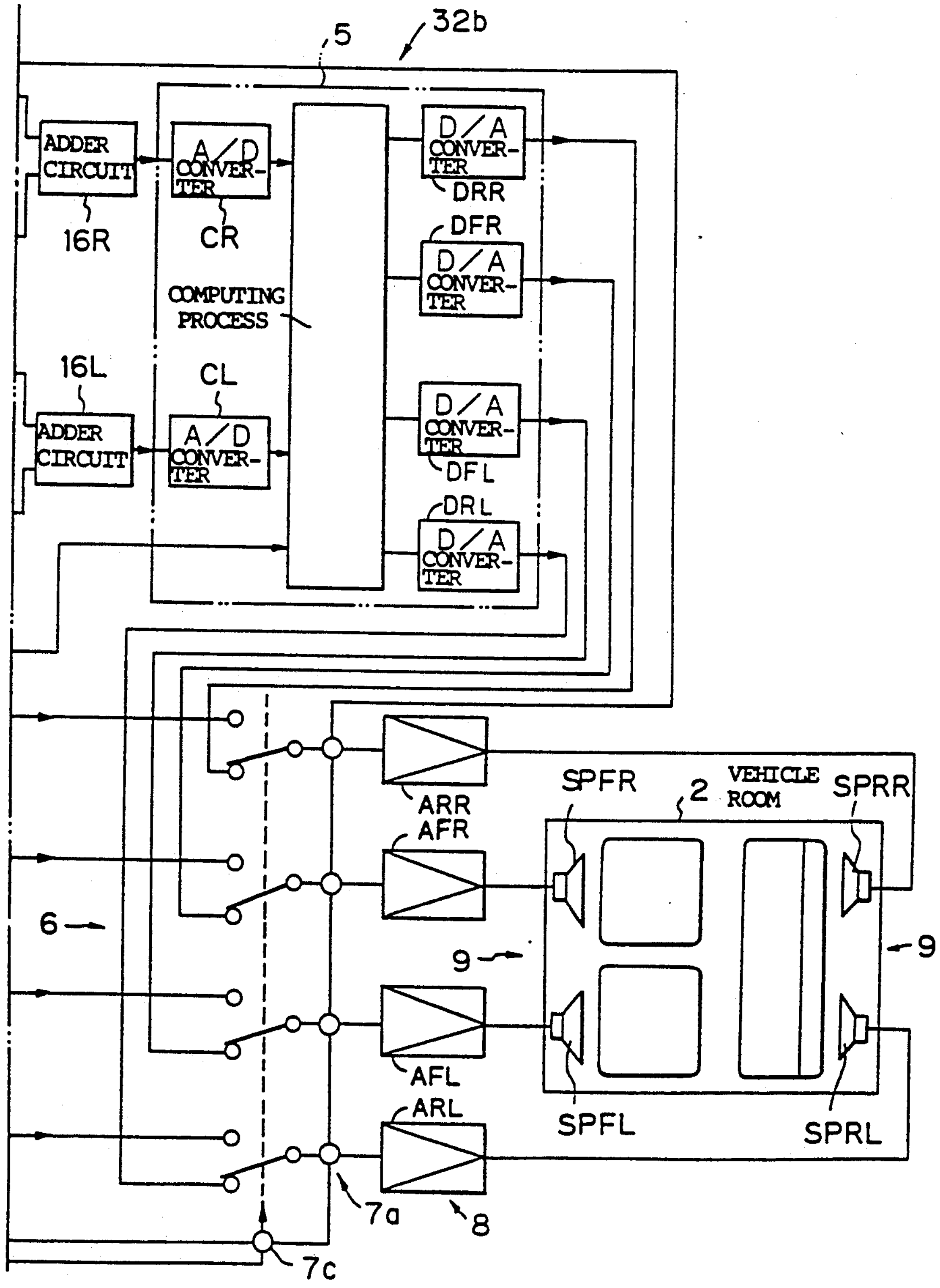

FIG. 12A and 12B are views showing a configuration controlling an fader controlling circuit and a sound field controller of an apparatus for reproducing a sound field using a common button switch, according to the sixth embodiment of the invention. An apparatus for reproducing a sound field as shown in these Fig. which is the same as that of the fifth embodiment of FIG. 10A, 10B is provided with the first part for reproducing a sound field 32a having terminals 7f and 7g to receive a control signal of a controller 17, and provided with the second part for reproducing a sound field 32b having terminals 7c and 7d. The controller 17 comprises a CPU171, a ROM (Read Only Memory) 172, a RAM (Random Access Memory) 173 and a timer 174. In addition, button switches SW21, SW22 and SW23 are provided extend to the controlled for receiving instructions externally.

Figure 13:
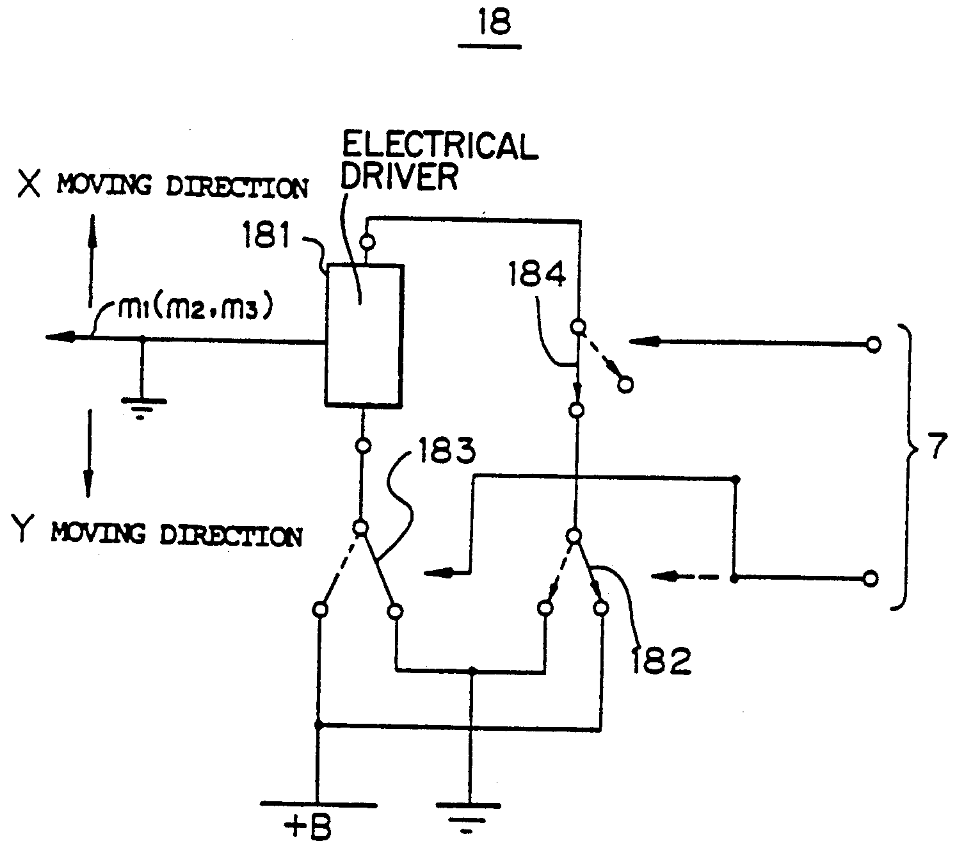
FIG. 13 is a view showing a controlling configuration of one driver of moving pieces (m1, m2, m3) of FIG. 12A.

FIG. 13 is a view showing a configuration of one driver of moving pieces (m1, m2, m3) of FIG. 12A. A driver as shown in this Figure comprises a moving piece m1 (m2, m3) for grounding an intermediate position of the volume VR1, an electrical driver 181 to which the power is applied across its terminals to activate the moving piece m1, switching parts 182 and 183 for switching the voltage of the power source (+B) to said terminals according to the controller, and a switch part 184 for allowing the power to be applied. Additionally, the mechanism on the moving piece m1 is not related to the invention, so its explanation is omitted for simplification. In this driver, the polarity inversion from the power causes the direction of the moving piece m1 to be opposite.

Figure 14:
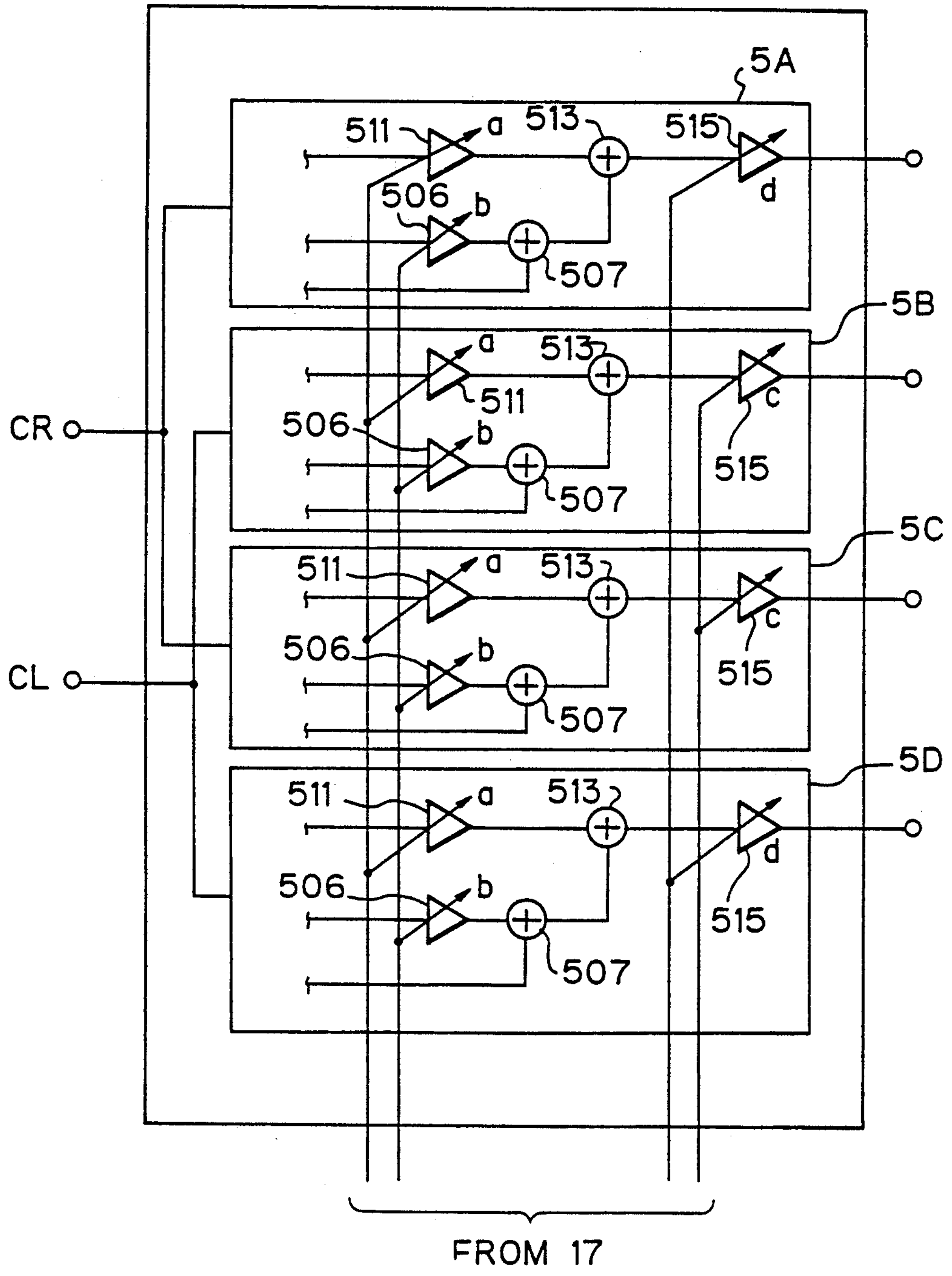
FIG. 14 is a view showing a controlling configuration of a computing process circuit of FIG. 12B.

FIG. 14 is a view showing a controlling configuration of a computing process circuit of FIG. 12B. As shown in this Figure, a coefficient a is set to the multiplier 511 for adjusting the level of the initial reflected sound in the computing process circuits 5A, 5B, 5C and 5D, a coefficient b is set to the multiplier 506 for adjusting the level of the reverberation sound, a coefficient c is set to the multiplier 515 in the computing process circuits 5B and 5C for the front seats, a coefficient d is set to the multiplier 515 in the computing process 5A and 5D for the rear seats.

Figure 15:
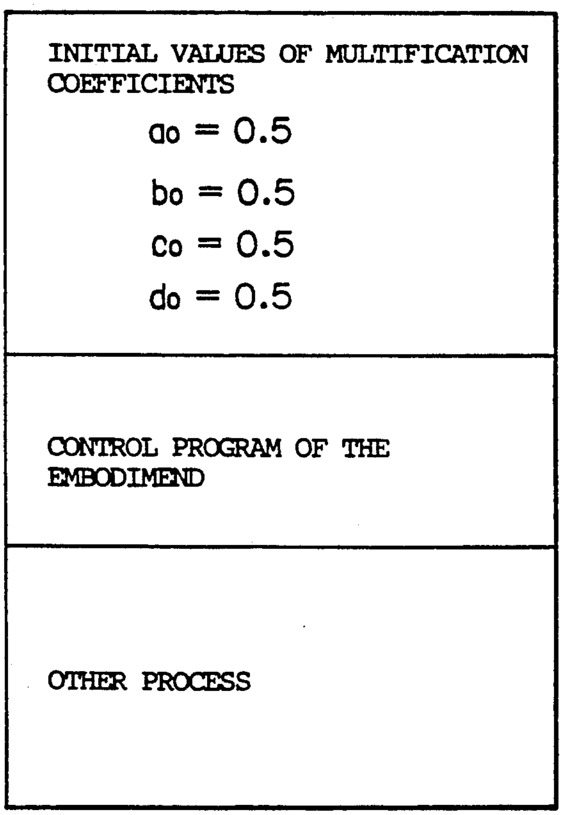
FIG. 15 is a view showing a ROM configuration of FIG. 12A.

FIG. 15 is a view showing a ROM configuration of FIG. 12A. This ROM stores initial values $a_0=0.5$, $b_0=0.5$, $c_0=0.5$ and $d_0=0.5$ in multiplication coefficients of the multiplier 506, 511, and 515 in the computing process circuit. Moreover, the ROM 172 stores a control program according to the embodiment mentioned later and the other process programs.

Next, a series of operations according to the sixth embodiment are described.

Figure 16A:
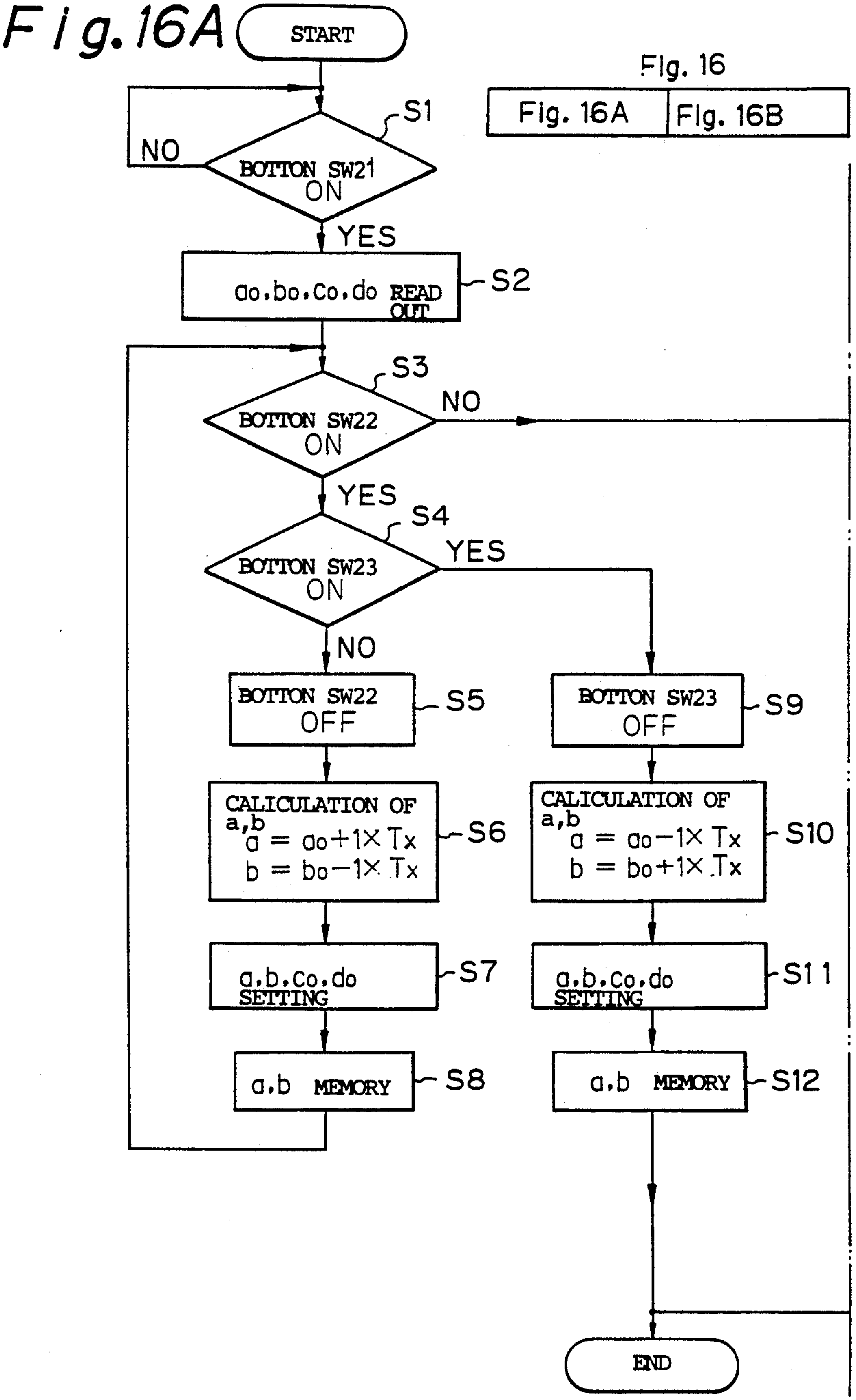
FIG. 16A and 16B are flowcharts illustrating a controlling operation of an apparatus for reproducing a sound field.
Figure 16B:
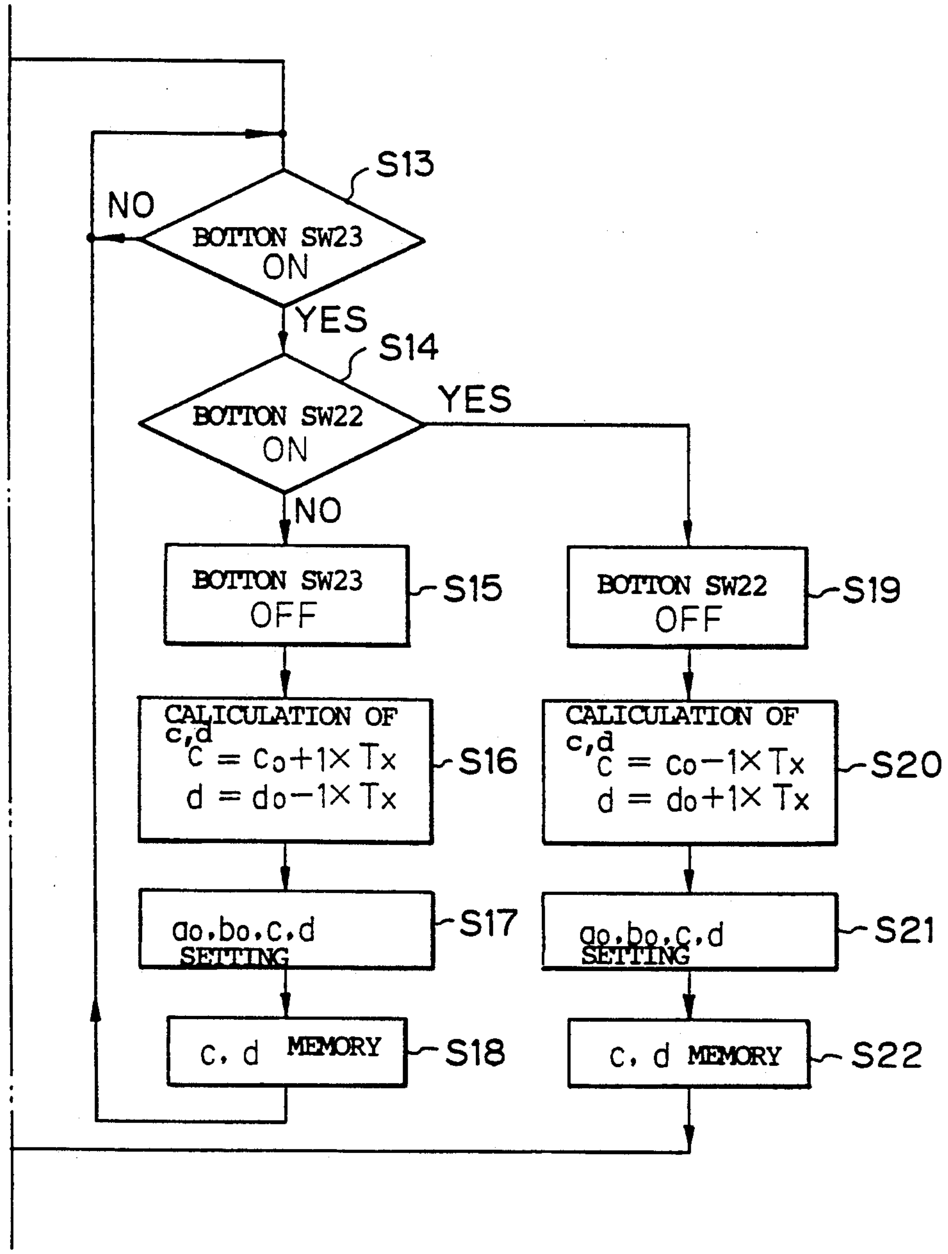

FIG. 16A and 16B are flow charts illustrating a controlling operation of an apparatus for reproducing sound field. In these Figures, as the button switch SW21 step 51 is turned ON, the switch 6 selects the sound field controller 5 through CPU 171, the switch part 184 of FIG. 13 is turned OFF, and the initial values $a_0=0.5$, $b_0=0.5$, $c_0=0.5$ and $d_0=0.5$ of the multiplication coefficients in the multipliers 505, 511 and 515 are read out from ROM 172 (step S2). Next, as the button switch SW22 is turned ON, the timer 174 is reset and started (step S3). If the button switch SW23 is OFF (Step S4), the timer 174 is stopped as the button switch SW22 is turned OFF (Step S5) and the measured time t of the timer 174 is read out by CPU 171. An early read out, using the above initial values $a_0$ and $b_0$, by CPU 171, is performed, for example, by the computation of $a=a_0+1\times Tx$, $b=b_0-1\times Tx$. Here, for example if the measured time t is 0.2, 0.4, 0.6 sec, . . . let Tx be Tx=0.1, 0.2, 0.3 . . . , and let a and b be a=1.0 and b=0.0 regarding $a\geqq 1.0$, $b\leqq 0.0$ (step S6). The multiplication coefficients obtained a, b, co and do in this way are set to the multiplier 506, 511 and 515 (step S7). In the case where multiplication coefficients c and d have been already obtained in RAM in the operation mentioned later, these coefficients may be set prior to multiplication coefficients $c_0$ and $d_0$. And the multiplication coefficients a and b are stored in RAM 173 (Step S8). Additionally, if the button switch SW23 is turned ON at the step S4, the timer 174 is reset and started. And as the button switch SW23 is turned OFF, the timer is stopped (step S9). The measured time t is read out by CPU 171, and an early read out using the above read out multiplication coefficients $a_0$ and $b_0$, is performed, for example, using the computation of $a=a_0-1\times Tx$, $b=b_0+1\times Tx$. Here, for example, if the measured time t is 0.2, 0.4, 0.6 sec . . . , let Tx be Tx=0.1, 0.2, 0.3, . . . , and let a and b be a=0.0 and 1.0 regarding $a\leqq 0.0$ and $b\geqq 1.0$ (step S10). In the same way as the above-mentioned, the multiplication coefficients a, b, $c_0$ and $d_0$ are set to the multiplier 506, 511 and 515 (step S11), and the multiplication coefficients a and b are stored in RAM 173 (step S12).

Next, at the step S3, if the button switch SW22 is OFF and the button switch SW23 is turned ON (step S13), the timer 174 is reset and started. If the button switch SW23 is turned OFF while the button switch SW22 is not turned ON (step S14), the timer 174 is stopped (step S15). In the same or similar way as the above-mentioned, the computation of c and d is performed (step S16), the multiplication coefficients $a_0$, $b_0$, c, and d are set to the multiplier 506, 511, 515 and the multiplication coefficients c and d are stored in the Ram 173 (step S18). At the step S14, if the button switch is turned ON, the timer 174 is reset and started. And when the button switch SW22 is turned OFF (step S19), the computation of the multiplication coefficients c and d is performed, the multiplication coefficients $a_0$, $b_0$, c and d are set to the multiplication 506, 511, 515, (step S21) and the multiplication coefficients c and d are stored in the same way with the above-mentioned in RAM 173 (step S22).

Figure 17A:
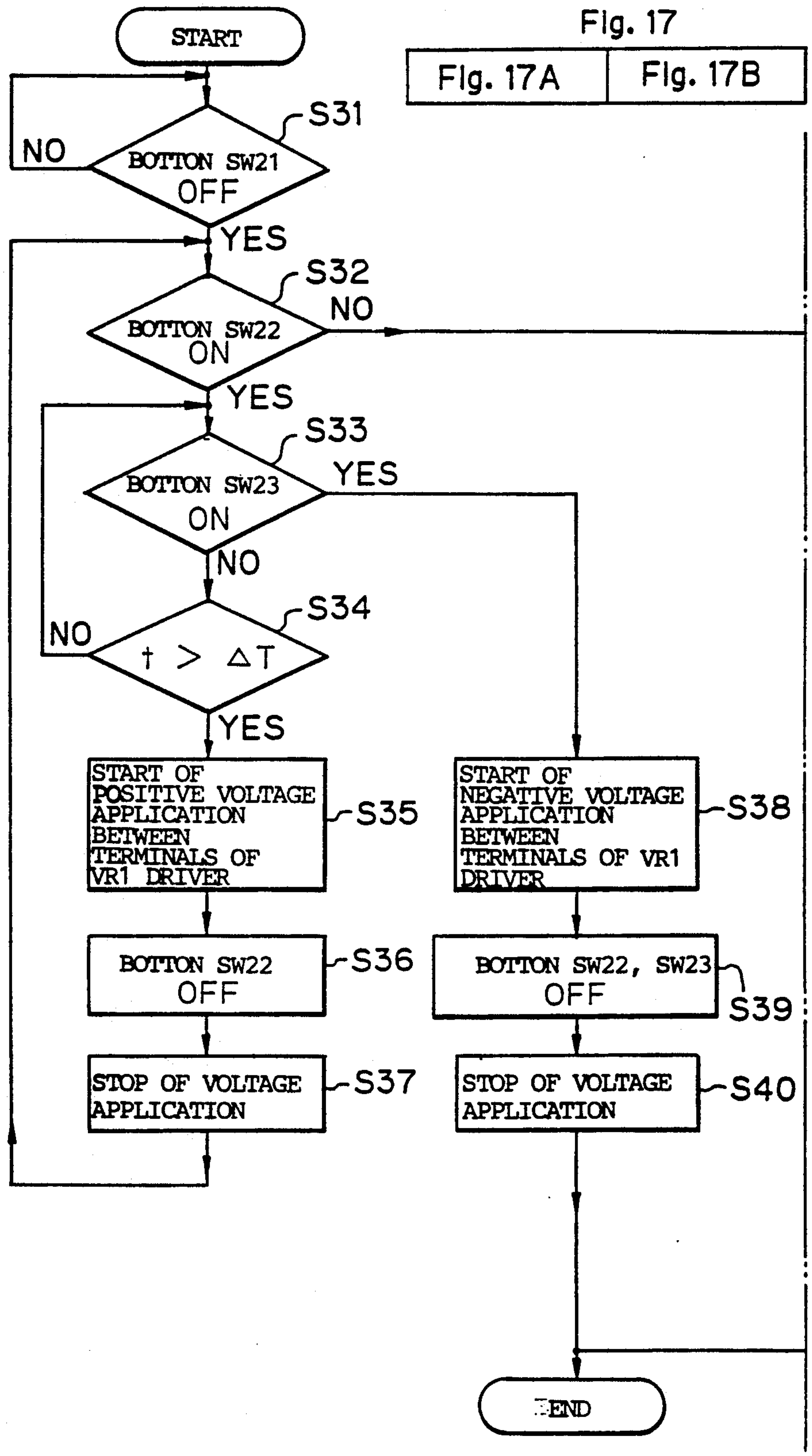
FIG. 17A and 17B are flowcharts illustrating a controlling operation of an apparatus for reproducing a sound field.
Figure 17B:
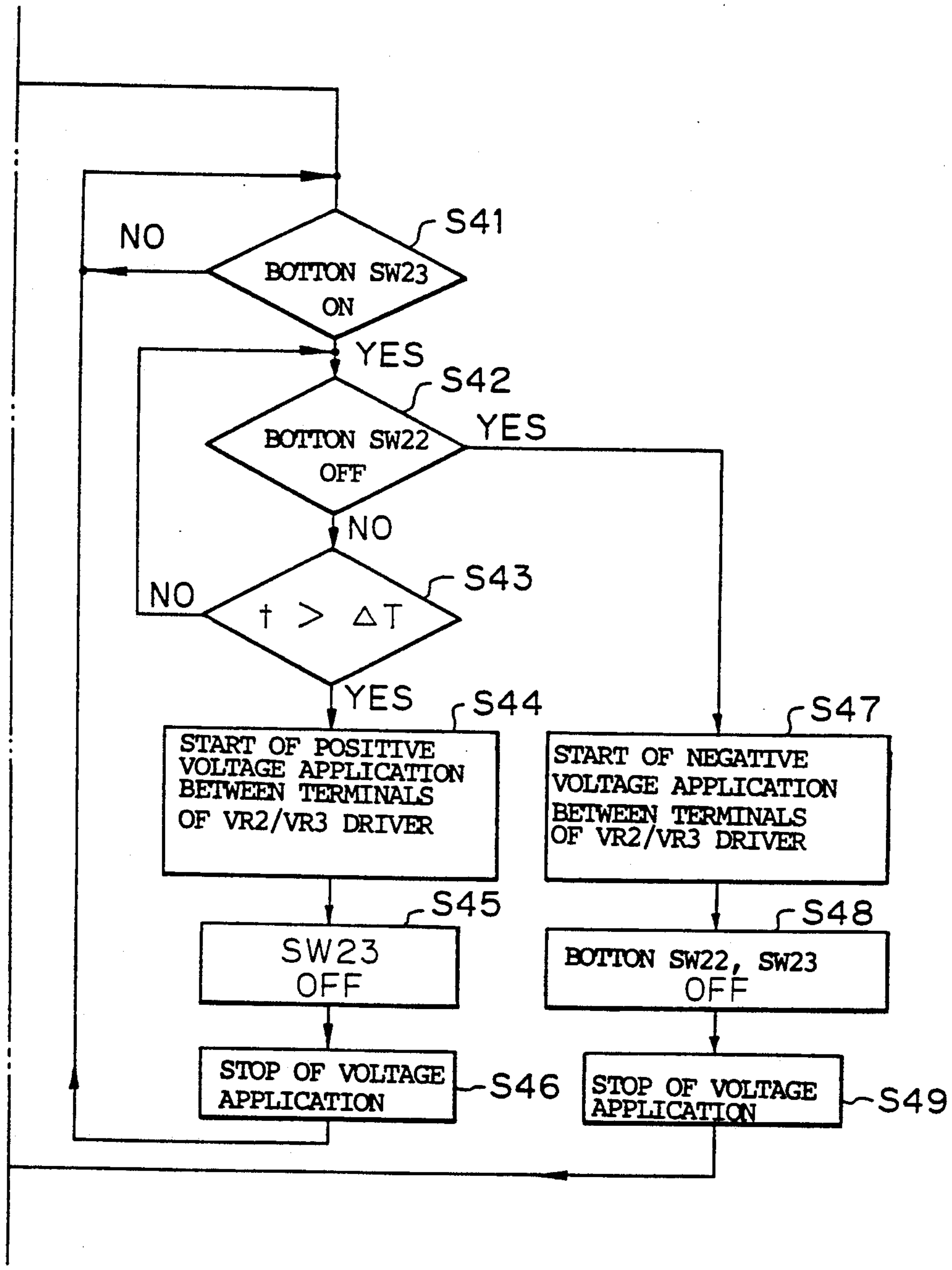

FIG. 17A and 17B is a flowcharts illustrating a controlling operation of an apparatus for reproducing a sound field. In these Figures, when the button switch SW21 is turned OFF through CPU 171, the switch 6 selects the fader controlling circuit 4 (step S31). Next, if the button switch SW22 is turned ON, the timer 174 is reset and started (step S38). At step S33, if the button switch SW23 is turned OFF, then the measured time is compared with a predetermined time. If the measured time of the timer elapses over the predetermined time (step S34), the switch 184 of FIG. 13 is turned ON.

Additionally, the application of the positive voltage across the terminals of the VR1 driver is started to activate the moving piece m1, for example, in the X direction (step S35). When the button switch SW22 is turned OFF (step S36), the switch 184 is turned OFF to stop the voltage application so that the movement of the moving piece m1 is stopped (step S37). At step S33, if the button switch SW23 is turned ON before the predetermined time ΔT elapses after the button switch 22 is turned ON, the switch 184 is turned ON and also the switch 182 and 183 is altered to start the application of negative voltage across the terminals of the VR1 driver (step S38) and to activate the moving piece m1 in the opposite Y direction. When the button switch 22 and 23 is turned OFF (step 39), the application of voltage is stopped and also the movement of the moving piece m1 is stopped (step S40). At step S32, if the button switch 23 is turned ON while the button switch SW22 is OFF (step S41-S42), the moving piece m2 and m3 travels in the X direction and is stopped (step S43, S44, S45, S46), and also if the button switch SW23 is on and the button switch SW22 is OFF, the moving piece m2 and m3 travels in the Y direction and are stopped (step or similar) in the same or similar way the above-mentioned.

According to the embodiment, the common button switch SW21, SW22, SW23, enable not only the fader controlling circuit 4 and the sound field controller 5 to be switched alternatively but also enables the volume of the analog circuit and the variable multiplier of the digital circuit to be adjusted.

The apparatus for reproducing a sound field according to the invention can be used for controlling the fader controlling circuit and the sound field controller. The invention is suitable for the audio system including the fader controlling circuit and the sound field controller installed in a vehicle.

The many features and advantages of the invention are apparent from the detailed specification and thus it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

We claim:

1. An apparatus for reproducing a sound field having a sound signal source producing sound signals, a fader controlling circuit connected to the sound signal source, and including a fader manipulating part for separating the sound signals from the sound signal source into predetermined channel signals and separated sound signals to adjust a level of each of the separated sound signals depending on an amount of manipulation of the fader manipulating part, said fader-controlling circuit comprising constant resistors having an input terminals, and a variable resistor connected to the constant resistors at a point, outputting output signals, and having a terminal which is connected to ground, said fader controlling circuit dividing variably the output signals of the point connecting the constant resistors and the variable resistor, relieving means for automatically invalidating a separate adjustment for the sound signals of the sound signal source responsive to the manipulation of the fader manipulating part of the fader controlling circuit, and a sound field controller for forming a desired sound field inside a vehicle, which is attached additionally to said apparatus and connected to an output of the fader controlling circuit for performing a computing process of each of the separated sound signals received from the fader manipulating part invalidated by said relieving means while said sound field controller is operated.

2. An apparatus for reproducing a sound field of claim 1, wherein said relieving means comprises switch means for switching a connection between said variable resistor and the ground while the sound field controller is operated.

3. An apparatus for reproducing a sound field of claim 1, wherein said sound signals are transmitted through channels, wherein said fader controlling circuit comprises an electronic volume control having a control input terminal for adjusting each of the sound signals of said channels depending on a voltage applied to the control input terminal, and wherein said relieving means comprises a level setting circuit connected to said fader controller circuit for setting a predetermined voltage applied to said control input terminal.

4. An apparatus for reproducing a sound field of claim 1, further comprising a sound field reproducing part connected to the sound signal source reproducing the sound field and having said fader controlling circuit, and the sound field controller separated from the sound field reproducing part reproducing the sound field, said sound field controller being connected at the input to the sound signal source and being alternately switched to the sound field reproducing part, wherein said sound field reproducing part comprising fader relieving means for invalidating a separate adjustment for the sound signals of the sound signal source by volume manipulation of said fader controlling circuit, and a fader relieving control terminal connected to said fader relieving means for controlling the fader relieving means, and wherein said sound field controller comprises a control terminal connected to said fader relieving control terminal to output signals representing operation of said sound field controller.

5. An apparatus for reproducing a sound field of claim 4, wherein said relieving means is connected between said fader controlling circuit and said sound field controller, and wherein the apparatus further comprises an adder circuit connected to said fader controlling circuit outputting a plurality of output signals, said adder circuit adding the plurality of output signals of said fader controlling circuit producing a result to be output to said sound field controller.

6. An apparatus for reproducing a sound field of claim 4, said sound field controller being connected at the input to said fader controlling circuit and being alternatively switches to the sound field reproducing part, said apparatus comprising relieving means for automatically invalidating a separate adjustment for the sound signals of the sound signal source responsive to the manipulation of the fader manipulating part of the fader controlling circuit while said sound field controller is operated, wherein said relieving means comprises switching means for directly inputting the sound signals of said sound signal source to the sound field controller while said sound field controller is operated, said sound field controller outputting first output signals, and said switching means for outputting the first output signals of the sound field controller to speakers through power amplifiers and directly inputting the sound signals of said sound signal source to the fader controlling circuit while said sound field controller is not operated, said sound field controller outputting second output signals, and said switching means for outputting the second output signals of the fader controlling circuit to the speakers through the power amplifiers.

7. An apparatus for reproducing a sound field of claim 1, wherein the computing process of said sound field controller is changed depending on the amount of manipulation of said fader manipulating part while said sound field controller is operated.

8. An apparatus for reproducing a sound field of claim 1, wherein said sound field controller includes channels having signal levels, and wherein a change of the computing process of said sound field controller controls the signal levels of the channels in said sound field controller depending on the amount of manipulation of said fader manipulating part.

* * * * *

UNITED STATES PATENT AND TRADEMARK OFFICE

CERTIFICATE OF CORRECTION

PATENT NO. : 5,285,503

DATED : February 8, 1994

INVENTOR(S) : Hirotoshi SATOH et al.

It is certified that error appears in the above-indentified patent and that said Letters Patent is hereby corrected as shown below:

COLUMN 1, Line 33, change "origination" to --originating--.
Line 49, after "other" insert --hand,--.
Line 56, after "stituted" insert --or constructed--.

COLUMN 2, Line 21, change "sounds signal" to --sound signals--.
Line 25, before "and" insert --each of the separated sound signals--.
Line 25, after "circuit" insert --to--.
Line 26, change "," to --.--.
Line 57, after "and" insert --the--.
Line 58, change "drawing" to --drawings--.

COLUMN 3, Line 49, before "ARR" insert --ARL--.
Line 58, change "and," to --and--.

COLUMN 4, Line 30, change "IL" to --ℓL--.
Line 35, change "IL and IR" to --ℓL and ℓR,--.
Line 41, change "IFL" to --ℓFL--.
Line 42, change "IRL" to --ℓRL--.
Line 45, change "IFR" to --ℓFR--.
Line 47, change "IRR" to --ℓRR--.
Line 48, change "1FL and IRL" to --ℓFL and ℓRL,--.
Line 49, change "IFR and IRR" to --ℓFR and ℓRR--.
Line 60, change "I1" to --ℓ1--.

COLUMN 5, Line 5, change "to digital analog" to --analog to digital--.
Line 5, change "CFR;" to --CFR,--.
Line 28, change "504," to --504. In addition the channel includes--.
Line 29, delete "51".
Line 62, change "ARR," to --(ARR,--.
Line 62, change "ARR, AFR, AF1, ARD" to --(ARR, AFR, AFL, ARL)--.

UNITED STATES PATENT AND TRADEMARK OFFICE

CERTIFICATE OF CORRECTION

PATENT NO. : 5,285,503
DATED : February 8, 1994
INVENTOR(S) : Hirotoshi SATOH et al.

It is certified that error appears in the above-indentified patent and that said Letters Patent is hereby corrected as shown below:

COLUMN 6, Line 59, change "l1" to --ℓ1--.
Line 63, change "l1" to --ℓ1--.

COLUMN 7, Line 5, change "40A" to --43A--.
Line 36, change "11a, 11b" to --(11a, 11b)--.
Line 52, after "8b" insert --,--.

COLUMN 8, Line 22, change "Fl" to --FL--.
Line 22, change "RU" to --RL--.
Line 36, change "circuit" to --circuits--.
Line 55, "($V_{SRL}$O) to --($V_{SRL}$-O)--.
Line 59, change "$R_2$32" to --$R_2$--.
Line 62, change "$V_{SFR}$" to --$V_{SFL}$--.
Line 68, after "32b" insert --in--.

COLUMN 9, Line 10, after "circuit" insert --4--.
Line 19, change "Fig." to --Figures--.
Line 20, change "10A, 10B" to --10B,--.
Line 29, change "extend" to --extended--.
Line 29, change "controlled" to --controller 17--.
Line 67, after "reproducing" insert --a--.

COLUMN 10 Line 1, change "step 51" to --(step 51)--.
Line 34, before "1.0" insert --b=--.
Line 47, change "multiplier" to --multipliers--.
Line 47, after "515" insert --(step S17)--.
Line 48, change "Ram" to --RAM--.
Line 54, change "multiplication" to --multipliers--.
Line 54, change "511, 515, (step S21)" to --551 and 515(step S21).--.
Line 54, after "521" insert --,--.
Line 58, change "is a" to --are--.

UNITED STATES PATENT AND TRADEMARK OFFICE

CERTIFICATE OF CORRECTION

PATENT NO. : 5,285,503

DATED : February 8, 1994

INVENTOR(S) : Hirotoshi SATOH et al.

It is certified that error appears in the above-indentified patent and that said Letters Patent is hereby corrected as shown below:

COLUMN 11 Line 9, change 22 to --SW22--.
Line 13, change "22 and 23" to --(SW22 and SW23)--.
Line 15, change "39" to --S39--.
Line 18, change "23" to --SW23--.
Line 18, after "is" insert --not--.
Line 23, change "travels" to --travel--.
Line 23, after "step" insert --S47, S48, S49)--.
Line 24, after "way" insert --as the--.
Line 26, change "SW23," to --SW23--.

Signed and Sealed this

Fifteenth Day of November, 1994

*Attest:*

BRUCE LEHMAN

*Attesting Officer* *Commissioner of Patents and Trademarks*